(12) United States Patent
San et al.

(10) Patent No.: US 8,994,572 B2
(45) Date of Patent: Mar. 31, 2015

(54) ANALOG-DIGITAL CONVERTER AND METHOD FOR CONVERTING ANALOG SIGNAL INTO DIGITAL SIGNAL

(75) Inventors: Hao San, Tokyo (JP); Tsubasa Maruyama, Tokyo (JP); Masao Hotta, Tokyo (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 14/346,260
(22) PCT Filed: Sep. 6, 2012
(86) PCT No.: PCT/JP2012/072786
§ 371 (c)(1),
(2), (4) Date: Mar. 20, 2014
(87) PCT Pub. No.: WO2013/042548
PCT Pub. Date: Mar. 28, 2013

(65) Prior Publication Data
US 2014/0300500 A1 Oct. 9, 2014

(30) Foreign Application Priority Data
Sep. 22, 2011 (JP) .................... 2011-207602

(51) Int. Cl.
H03M 1/34 (2006.01)
H03M 1/14 (2006.01)
(Continued)

(52) U.S. Cl.
CPC .............. *H03M 1/14* (2013.01); *H03M 1/0695* (2013.01); *H03M 1/1205* (2013.01); *H03M 1/0609* (2013.01); *H03M 1/40* (2013.01)
USPC ........... 341/163; 341/118; 341/120; 341/155; 341/161; 341/162

(58) Field of Classification Search
CPC ....... H03M 1/442; H03M 1/12; H03M 1/164; H03M 1/1061; H03M 1/1004; H03M 1/44; H03M 1/1019; H03M 1/1215; H03M 1/1225; H03M 1/403; H03M 1/40; H03M 1/46; H03M 1/00; H03M 1/162; H03M 1/165
USPC .................. 341/118, 120, 155, 161, 162, 163
See application file for complete search history.

(56) References Cited

U.S. PATENT DOCUMENTS 6,882,292 B1 * 4/2005 Bardsley et al. .............. 341/121
6,967,611 B2 * 11/2005 Atriss et al. .................... 341/172
(Continued)

FOREIGN PATENT DOCUMENTS

JP 2001352244 A 12/2001
(Continued)

OTHER PUBLICATIONS

Daubechies, I. et al., "Beta Expansions: A New Approach to Digitally Corrected A/D Conversion," *IEEE* (2002)II-784-II-787.
(Continued)

*Primary Examiner* — Linh Nguyen
(74) *Attorney, Agent, or Firm* — Kilpatrick Townsend & Stockton LLP

(57) ABSTRACT

The objective of the invention is to provide an A/D converter that exhibits fewer malfunctions due to variations in manufacturing. An A/D converter (1) of the invention, which is a cyclic type of analog/digital converter for converting an analog input signal to a digital signal having a predetermined resolution, comprises: a digital approximation unit (10) that includes a comparing unit (13) for comparing the magnitude of an input first analog signal with a threshold value to output a digital value indicating a result of the comparison and that also includes an MDAC unit (14) for amplifying the first analog signal to β-fold, where β is greater than one but smaller than two, and for executing a predetermined computation in accordance with the result of the comparison of the comparing unit to output a second analog signal; a multiplexer (20) that, if the MSB is to be computed, outputs the analog input signal and, otherwise, outputs the second analog signal as the first analog signal; a β estimating unit (30) that estimates the value of β; and a digital signal outputting unit (40) that sequentially takes in digital values outputted by the comparing unit and that outputs the taken-in digital values as the digital signal.

16 Claims, 26 Drawing Sheets

(51) Int. Cl.
H03M 1/06 (2006.01)
H03M 1/12 (2006.01)
H03M 1/40 (2006.01)

(56) References Cited

U.S. PATENT DOCUMENTS

| | | | |
|---|---|---|---|
| 7,259,708 B2* | 8/2007 | Lu | 341/163 |
| 7,271,750 B1* | 9/2007 | Ali | 341/118 |
| 7,486,218 B2* | 2/2009 | Horie | 341/163 |
| 7,535,391 B1* | 5/2009 | Newman et al. | 341/131 |
| 7,589,658 B2* | 9/2009 | Ren et al. | 341/161 |
| 7,649,488 B1* | 1/2010 | Johansson | 341/163 |
| 8,344,926 B2* | 1/2013 | Decaens | 341/161 |
| 2008/0106453 A1 | 5/2008 | Hotta et al. | |
| 2008/0198057 A1 | 8/2008 | Kurauchi | |
| 2009/0027249 A1* | 1/2009 | Marvasti | 341/155 |
| 2009/0102688 A1* | 4/2009 | Cesura et al. | 341/110 |
| 2010/0207796 A1 | 8/2010 | Hironaka et al. | |
| 2011/0169678 A1* | 7/2011 | Wang et al. | 341/144 |

FOREIGN PATENT DOCUMENTS

| JP | 2008124572 A | 5/2008 |
|---|---|---|
| JP | 2008205704 A | 9/2008 |
| WO | 2009/014057 A1 | 1/2009 |

OTHER PUBLICATIONS

Daubechies, Ingrid et al., "Robust and Practical Analog-to-Ditigal Conversion With Exponential Precision," *IEEE Transactions on Information Theory* (Aug. 2006) 52(8):3533-3545).

Ingino, Joseph M. et al., "A Continuously Calibrated 12-b, 10-MS/s, 3.3-V A/D Converter," *IEEE Journal of Solid-State Circuits* (Dec. 1998) 33(12):1920-1931.

International Search Report corresponding to PCT/JP2012/072786 mailed Oct. 9, 2012 with English translation (3 pages).

Karanicolas, Andrew N. et al., "A 15-b 1-Msample/s Digitally Self-Calibrated Pipeline ADC," *IEEE Journal of Solid-State Circuites* (Dec. 1993) 28(12):1207-1215.

Kohda, Tohru, "Signal Processing Using Chaotic Dynamics—Discrete Chaos and its Applications to Digital Communications," *Fundamentals Review* (2009) 2(4):16-36.

Office Action for corresponding Japanese application, No. 2011-207602 mailed Aug. 13, 2013 (4 pages).

* cited by examiner $Q_S = V_{in}(C_a + C_b)$ $$Q_T = C_a(\pm V_{ref}) + C_b \cdot V_{res}$$

$Q_{S\_Re} = V_{res}(C_a + C_b)$

CONVENTIONAL A/D CONVERSION

A/D CONVERTER ACCORDING TO THE PRESENT INVENTION

ERROR IN THRESHOLD VALUE

ERROR IN AMPLIFICATION FACTOR

FIG. 13

$$(\beta-1)\sum_{i=1}^{N}b_i\beta^{-i}$$
$$=(\beta-1)b_1\beta^{-1}+(\beta-1)b_2\beta^{-2}+\cdots$$

| $\beta$ (address) | POWER | | | | | |
|---|---|---|---|---|---|---|
| | 0 | 1 | 2 | ... | e | f |
| 1.1(0×0) | $\beta^{-1}$ | $\beta^{-2}$ | $\beta^{-3}$ | ... | $\beta^{-15}$ | $\beta^{-16}$ |
| 1.2(0×10) | $\beta^{-1}$ | $\beta^{-2}$ | $\beta^{-3}$ | ... | $\beta^{-15}$ | $\beta^{-16}$ |
| 1.3(0×20) | $\beta^{-1}$ | $\beta^{-2}$ | $\beta^{-3}$ | ... | $\beta^{-15}$ | $\beta^{-16}$ |
| | | | | | | |

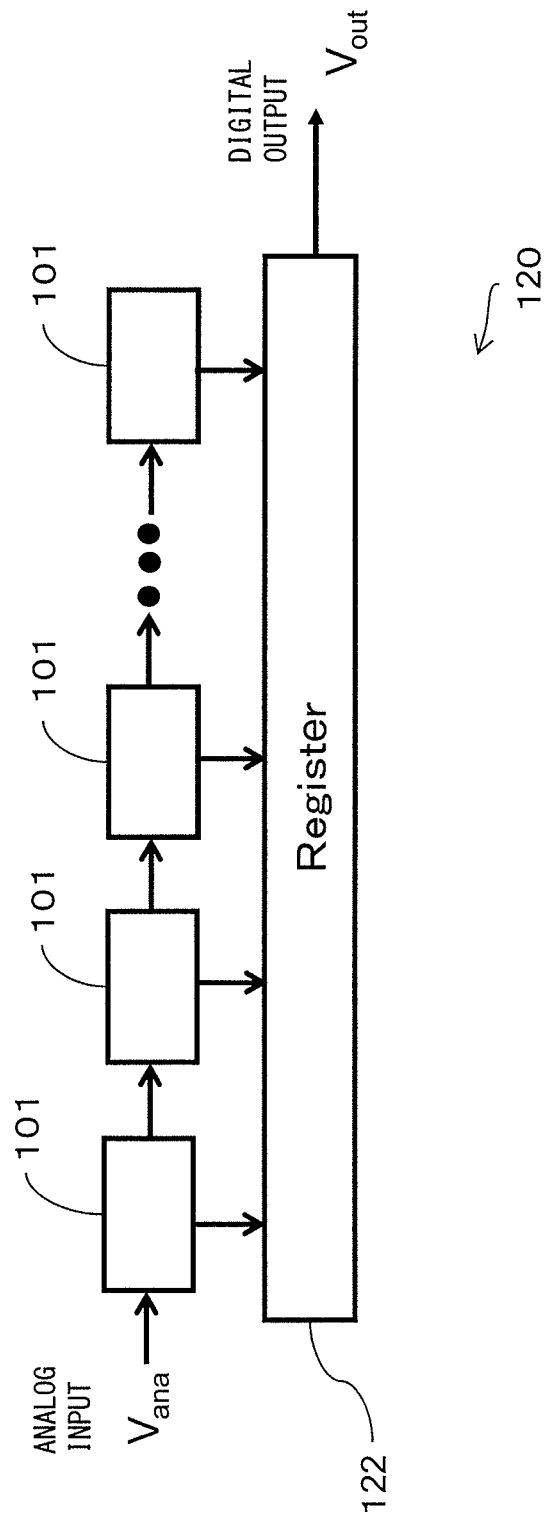

INPUT/OUTPUT CHARACTERISTICS OF DIGITAL APPROXIMATOR

INPUT/OUTPUT CHARACTERISTICS OF AD CONVERTER

INPUT/OUTPUT CHARACTERISTICS OF DIGITAL
APPROXIMATOR CIRCUIT

ANALOG-DIGITAL CONVERTER AND METHOD FOR CONVERTING ANALOG SIGNAL INTO DIGITAL SIGNAL

FIELD

The present invention relates to an analog-digital converter and a method for converting an analog signal into a digital signal. In particular, the present invention relates to a cyclic-type analog-digital converter and a pipeline-type analog-digital converter, and a method for converting an analog signal into a digital signal by a cyclic-type analog-digital converter and a pipeline-type analog-digital converter.

BACKGROUND

At present, due to development of semiconductor integrated circuits, it is common to process an analog signal detected from a sensor element, etc., as a digital signal in a signal processing unit within a semiconductor device. Thus, an analog-digital converter (hereinafter, also referred to as AD converter) for converting an analog signal into a digital signal is an absolutely indispensable element used in many semiconductor devices and there is a case where the performance of the AD converter determines the performance of the entire system mounted on the semiconductor device. Thus, it is necessary to improve the performance of the AD converter mounted on the semiconductor device, such as a microcomputer and system LSI, and there are a variety of techniques known for improving the performance of the AD converter. For example, by adopting the cyclic type AD converter described in Patent Document 1, it is possible to reduce the size and by adopting the pipeline type AD converter described in Patent Document 2, it is possible to increase the processing speed.

FIG. 16A is a diagram illustrating a digital approximator 101 having a 1-bit configuration used as a basic circuit in the conventional cyclic-type analog-digital converter and pipeline-type analog-digital converter. The digital approximator 101 includes a sample holder 102 configured to sample and hold an input signal $V_{in}$ and to generate a sampling signal $V_s$, a comparator 103 configured to compare the sampling signal $V_s$ and a threshold value $V_{th}$ and to output a digital value $Q_{out}$ indicative of the comparison result, and a multiplying digital-analog converter (hereinafter, also referred to as MDAC) 104 configured to amplify the sampling signal $V_s$ by a factor of 2 and at the same time, to perform a calculation in accordance with the comparison result of the comparator 103 to generate a residual signal $V_{res}$. In the case of AD conversion with unipolar code, the threshold value $V_{th}$ is half the value of a full-scale signal $V_{FS}$ of the input signal $V_{in}$. On the other hand, in the case of AD conversion with bipolar code, the threshold value $V_{th}$ corresponds to the voltage of direct-current (hereinafter, also referred to as DC) difference 0 V. The comparator 103 is configured to output 1 in the case where the sampling signal $V_s$ is larger than the threshold value $V_{th}$ and to output 0 in the case where the sampling signal $V_s$ is smaller than the threshold value $V_{th}$. The MDAC 104 performs a calculation to amplify the value of a difference between the sampling signal $V_s$ and the threshold value $V_{th}$ by a factor of 2 in the case where the sampling signal $V_s$ is larger than the threshold value $V_{th}$. On the other hand, in the case where the sampling signal $V_s$ is smaller than the threshold value $V_{th}$, the MDAC 104 performs a calculation to amplify the sampling signal $V_s$ by a factor of 2.

FIG. 16B is a diagram illustrating an example of the input/output characteristic of the digital approximator 101. In FIG. 16B, the horizontal axis represents the input signal $V_{in}$ and the vertical axis represents the residual signal $V_{res}$. The $V_{FS}$ is the full-scale value of the input signal $V_{in}$ and the residual signal $V_{res}$, and the threshold value $V_{th}$ is a value half the full-scale value $V_{FS}$. The input signal $V_{in}$ is amplified by a factor of 2 in the MDAC 104, and therefore the slope of a straight line indicating the input/output characteristic of the digital approximator 101 is 2. Further, when the input signal $V_{in}$ becomes larger than the threshold value $V_{th}$, the MDAC 104 amplifies the value of a difference between the input signal $V_{in}$ and the threshold value $V_{th}$ by a factor of 2. Thus, the input/output characteristics have the linear characteristic between 0 of the input signal $V_{in}$ and the threshold value $V_{th}$, and between the threshold value $V_{th}$ and the full-scale value $V_{FS}$, respectively, and have the characteristics that the same characteristics are repeated between 0 of the input signal $V_{in}$ and the threshold value $V_{th}$, and between the threshold value $V_{th}$ and the full-scale value $V_{FS}$.

FIG. 17A is a diagram illustrating a cyclic type AD converter 110 including the digital approximator 101. The cyclic type AD converter 110 has a multiplexer 111 configured to selectively output an analog input signal $V_{ana}$ and the residual signal $V_{res}$ based on a selection signal S, the digital approximator 101 configured to receive an output signal of the multiplexer 111, and a register 112 configure to sequentially store the digital value $Q_{out}$ output from the comparator 103 and to output the value $Q_{out}$ as a digital signal $D_{out}$. The multiplexer 111 is configured to form a feedback circuit by selecting the analog input signal $V_{ana}$ only when the digital approximator 101 calculates the most significant bit (hereinafter, also referred to as MSB) and by selecting an output signal of the digital approximator 101 when the digital approximator 101 calculates bits other than the MSB.

With reference to FIG. 16C, the sequence of the operation of the cyclic type AD converter 110 is explained. FIG. 16C is a diagram illustrating an example of a sequence to generate a 5-bit digital signal using the cyclic type AD converter 110. A bar B101 indicates the input signal $V_{in}$ input from the outside of the cyclic type AD converter 110 via the multiplexer 111. In this example, the input signal $V_{in}$ is larger than the threshold value $V_{th}$, and therefore the comparator 103 of the digital approximator 101 outputs 1 as the digital value $Q_{out}$. The MDAC 104 of the digital approximator 101 generates the residual signal $V_{res}$ by performing a calculation to amplify the value of a difference between the input signal $V_{in}$ and the threshold value $V_{th}$ by a factor of 2 in accordance with the comparison result of the comparator 103.

Next, the residual signal $V_{res}$ generated in the MDAC 104 is fed back to the input of the digital approximator 101 via the multiplexer 111. A bar B102 indicates the residual signal $V_{res}$ that is fed back to the input of the digital approximator 101 via the multiplexer 111. The signal of the second bit indicated by the bar B102 is smaller than the threshold value $V_{th}$, and therefore the comparator 103 of the digital approximator 101 outputs 0 as the digital value $Q_{out}$. The MDAC 104 of the digital approximator 101 generates the residual signal $V_{res}$ by performing a calculation to amplify the input signal $V_{in}$ by a factor of 2 in accordance with the comparison result of the comparator 103. A bar B103 is a feedback signal of the residual signal $V_{res}$ of the second bit and corresponds to the input signal $V_{in}$ of the third bit. Hereinafter, in the similar manner, the comparator 103 generates a digital signal and at the same time, the MDAC 104 generates the residual signal $V_{res}$ used as the input signal $V_{in}$ of the next stage in accordance with the comparison result of the comparator 103. As a result, in the example illustrated in FIG. 16C, the digital signal $D_{out}$ of (10101) is obtained.

FIG. 16D is a diagram illustrating a sequence in the case where the input signal $V_{in}$ the same as that in FIG. 16C is input to the cyclic type AD converter 110 in which the signal amplification degree of the MDAC 104 is 2.1, not 2.0. Despite that the input signal $V_{in}$ the same as that in FIG. 16C is input, in FIG. 16D, the lower-order two bits corresponding to bars B204 and B205 having slashes are converted erroneously and a digital signal (10110) is generated. This erroneous conversion results from the fact that the signal amplification degree is 2.1, not 2.0 and is caused by the erroneous calculation of the digital approximator 101.

Further, in the digital approximator 101, there is a possibility that erroneous conversion occurs also in the case where there is an offset in an operational amplifier used for signal amplification or in the case where there is a deviation in the threshold voltage $V_{th}$. FIGS. 18A to 18F illustrate examples of the AD conversion error. FIGS. 18A and 18B illustrate examples of occurrence of miscoding due to a deviation in the threshold voltage $V_{th}$. As illustrated in FIG. 18A, the $V_{th}$ becomes larger than the half of the full-scale value $V_{FS}$ and the residual signal $V_{res}$ exceeds the full-scale value $V_{FS}$, and therefore miscoding as illustrated in FIG. 18B occurs.

FIGS. 18C and 18D illustrate examples of occurrence of a conversion error due to a gain error in the case where the amplification degree of the MDAC 104 exceeds 2. As illustrated in FIG. 18C, when the input signal $V_{in}$ is in the vicinity of the threshold value $V_{th}$, the residual signal $V_{res}$ exceeds the full-scale value $V_{FS}$. Thus, such a conversion error as illustrated in FIG. 18D occurs. Further, FIGS. 18E and 18F illustrate examples of occurrence of miscoding due to a gain error in the case where the amplification degree of the MDCA 104 is less than 2.

As described above, in the conventional cyclic type AD converter 110, it is possible that a conversion error may occur in the case where the amplification degree of the MDCA 104 is not exactly 2, in the case where there is a deviation in the threshold voltage $V_{th}$, and in the case where there is an offset in the operational amplifier. Thus, it is necessary to set the amplification degree of the MDCA 104 exactly to 2, to set the $V_{th}$ to the $V_{FS}/2$, and to set the offset of the operational amplifier substantially to zero.

FIG. 17B is a diagram illustrating a pipeline type AD converter 120. The pipeline type AD converter 120 includes a plurality of digital approximators 101 connected in series to the input unit to which the analog input signal $V_{ana}$ is input. While the cyclic type AD converter 110 illustrated in FIG. 17A generates a digital signal by successive approximation by configuring a feedback circuit by one digital approximator 101, the pipeline type AD converter 120 uses the residual signal $V_{res}$ generated by the digital approximator 101 in the previous stage as the input signal $V_{in}$ of the digital approximator 101 in the subsequent stage, which is the difference between both the AD converters. However, the sequence to generate the digital signal $D_{out}$ from the analog input signal $V_{ana}$ using the pipeline type AD converter 120 is the same as that of the cyclic type AD converter 110 as illustrated in FIG. 16C. Thus, in the pipeline type AD converter 120 also, as in the cyclic type AD converter 110, it is necessary to set the amplification degree of the MDCA 104 exactly to 2, to set the $V_{th}$ to the $V_{FS}/2$, and to set the offset of the operational amplifier substantially to zero.

As illustrated in Non-patent Document 1 and Patent Document 3, the β conversion type AD converter and the β conversion type DA converter that have focused attention on the relationship between the Markov chain and the β conversion are known. The β conversion type AD converter and the β conversion type DA converter are converters that have a high accuracy and which cover the unstableness of the circuit element by utilizing the β extension.

The β conversion type AD converter is explained simply below. The AD converter 110 described in Patent Documents 1 and 2 utilizes the fact that the relationship between a binary code bi obtained by N-step (N-bit) AD conversion for the input signal $V_{in}$ with the full-scale value being taken to be $V_{FS}$ and the AD conversion value is expressed by expression (1).

$$\frac{V_{in}}{V_{FS}} = \sum_{i=1}^{N} b_i 2^{-i} \tag{1}$$

In contrast to this, the β conversion type AD converter utilizes the β extension expressed by expression (2).

$$\frac{V_{in}}{V_{FS}} = (\beta - 1)\sum_{i=1}^{\infty} b_i \beta^{-i} \tag{2}$$

In the expression (2), the value of β is a number larger than 1 and smaller than 2. In other words, the β conversion type AD converter is not a converter that encodes a digital signal by binary coding (hereinafter, also referred to as a binary digital signal) as described in Patent Documents 1 and 2 but a converter that encodes a digital signal by β-adic coding (hereinafter, also referred to as a β-adic digital signal) using the value of β, which is a number larger than 1 but smaller than 2.

In the β conversion type AD converter also, there is a possibility that miscoding occurs in the case where the value of the amplification degree of β deviates and the amplification degree exceeds 2, or in the case where there is a deviation in the threshold voltage $V_{th}$, or in the case where there is an offset in the operational amplifier. Thus, also in the case where the β conversion type AD converter is used, it is necessary to select the value of β so that the residual signal multiplied by β does not exceed the input range of $\pm V_{ref}$ regardless of the variations in the semiconductor manufacturing or the change in the use environment. Further, unless conversion into a binary number is carried out using an accurate value of the amplification degree of β, an error occurs, and therefore it is necessary to know the value of the amplification degree of β with a high accuracy.

As another method for reducing the influence of an offset, a digital approximator having a 1.5-bit configuration that uses the two comparators 103 is adopted. FIG. 19 is a diagram illustrating an example of the input/output characteristics of the digital approximator having a 1.5-bit configuration. In the case where the digital approximator having a 1.5-bit configuration is adopted, it is not necessary to switch the input signals in the vicinity of the full-scale value $V_{FS}$ and it is possible to reduce the influence of the deviation in the threshold value $V_{th}$ and the offset.

PRIOR ART DOCUMENT

Patent Document

[Patent Document 1] Japanese Unexamined Patent Publication (Kokai) No. 2008-124572

[Patent Document 2] Japanese Unexamined Patent Publication (Kokai) No. 2008-205704

[Patent Document 3] Domestic re-publication of PCT international application No. 2009-014057

Non-Patent Document

[Non-patent Document 1] "Signal Processing Using Chaotic Dynamics" (Tohru KOHDA, "Fundamentals Review" (Vol. 2, No, 4, The Institute of Electronics, Information and Communication Engineers, 2009, April))

SUMMARY OF THE INVENTION

Problem to be Solved by the Invention

However, the conventional AD converter has a problem that there is a possibility that an erroneous operation, such as miscoding, may happen, since the amplification degree, the deviation in the threshold voltage $V_{th}$, or the offset or the amplification degree, or both the deviation in the threshold value $V_{th}$ and the offset vary due to the variations in the specifications of the AD converter, such as the power source voltage and the range of temperature in which the device can be used, and in the manufacturing conditions of the semiconductor device on which the AD converter 1 is mounted. In the case where the digital approximator having a 1.5-bit configuration is used, there is such a problem that the circuit scale increases, since two comparators are used. Further, it is possible for the digital approximator having a 1.5-bit configuration to reduce the influence of the deviation in the threshold value $V_{th}$ and the influence of the offset, however, it is difficult to suppress the occurrence of miscoding resulting from the gain error. Thus, in order to manufacture an AD converter having a designed amplification degree, an amplifier having a high amplification degree and a capacitor having a high relative accuracy regardless of the magnitude of the amplification degree are necessary. However, accompanying the miniaturization of the semiconductor process, the variations in the manufacturing conditions become large and there is a possibility that it becomes difficult to manufacture an amplifier having a high amplification degree and a capacitor having a high relative accuracy. In other words, there is a problem that it is difficult to implement an amplifier circuit having a high amplification degree, since the semiconductor process is miniaturized and the variations in the manufacturing conditions become large and at the same time, the performance of the transistor deteriorates, and therefore it is difficult to manufacture an amplifier circuit having a designed amplification degree. Furthermore, there is a problem that it is not possible to receive the benefits of miniaturization, since it is necessary to increase the area of the capacitor in order to implement a capacitor having a high relative accuracy.

An object of the present invention is to provide an AD converter that solves the above-mentioned problems and the conversion error of which due to the variations in the manufacturing conditions is small.

Means for Solving Problem

In order to achieve the above-mentioned object, the analog-digital converter according to the present invention is characterized in having an estimator configured to estimate the value of the amplification degree of β in the MDCA. The analog-digital converter according to the present invention has the estimator configured to estimate the value of β, and therefore even if the value of β varies due to the variations in the manufacturing conditions, etc., an error, such as miscoding, does not occur. Thus, in the analog-digital converter according to the present invention, it is not necessary to manufacture an amplifier circuit having the same amplification degree as the designed amplification degree and it is not necessary to increase the relative accuracy of the capacitor, and therefore it is not necessary to have a capacitor with a large area. It is possible to provide an AD converter with a high accuracy not depending on the manufacturing technique by the present invention.

Further, it is preferable for the analog-digital converter according to the present invention to determine the number of bits of a digital signal used when estimating the value of β by taking into consideration the resolution in the worst-case design. It is possible to easily determine the worst-case design by specifying various conditions, such as the variations in the manufacturing conditions of the semiconductor device, and then, by performing a simulation. By determining the number of bits of the digital signal used when estimating the value of β by using the worst-case design, it is possible to obtain a sufficient resolution even in the worst-case design and at the same time, estimation processing without redundancy is enabled.

In order to achieve the above-mentioned object, the analog-digital converter of an embodiment according to the present invention is a cyclic type analog-digital converter for converting an analog input signal that is input into a digital signal having a predetermined resolution, the analog-digital converter having:

a digital approximator including a comparator configured to compare the magnitude of a first analog signal that is input and a threshold value and to output a digital value indicative of the comparison result and a multiplying digital-analog converter configured to amplify the first analog signal by a factor of β and at the same time, to output a second analog signal by performing a calculation in accordance with the comparison result of the comparator;

a multiplexer configured to output an analog input signal as the first analog signal when calculating the most significant bit, and to output the second analog signal as the first analog signal when calculating bits other than the most significant bit;

a β estimator configured to estimate the value of β; and a digital signal output unit configured to sequentially take in the digital value output from the comparator and to output the digital value as a digital signal based on an estimated value of β, wherein the value of β is a value larger than 1 and smaller than 2.

Further, in order to achieve the above-mentioned object, the analog-digital converter of another embodiment according to the present invention is a pipeline type analog-digital converter for converting an analog input signal that is input to an input terminal into a digital signal having a predetermined resolution, the analog-digital converter having:

a plurality of digital approximators including a comparator configured to compare the magnitude of a first analog signal that is input and a threshold value and to output a digital value indicative of the comparison result and a multiplying digital-analog converter configured to amplify the first analog signal by a factor of β and at the same time, to output a second analog signal by performing a predetermined calculation in accordance with the comparison result of the comparator, the plurality of digital approximators being connected in series to the input terminal and the second analog signal of the digital approximator in the previous stage being provided to the digital approximator in the subsequent stage as the first analog signal;

a β estimator configured to estimate the value of β of at least one of the plurality of digital approximators; and a digital signal output unit configured to sequentially take in the digital value output from the comparator and to output the digital value as a digital signal based on an estimated value of β, wherein the value of β is a value larger than 1 and smaller than 2.

Further, in the analog-digital converter according to the present invention, it is preferable:

for the β estimator to estimate the value of β using two β-adic digital signals having a predetermined number of bits acquired by converting the same input signal; and for the predetermined number of bits of a plurality of β-adic digital signals used when estimating the value of β to be specified so that the resolution in the case where the value of β is the value in the worst-case design is substantially equal to the predetermined resolution. It is possible for the analog-digital converter to obtain a necessary resolution even in the worst-case design and estimation processing without redundancy is enabled.

Further, in the analog-digital converter according to the present invention, it is preferable for the number of bits of the digital signal to be determined so that the resolution of the estimated value of β is substantially equal to the predetermined resolution. It is possible for the analog-digital converter to obtain a necessary resolution even if the value of β changes due to the variations in the manufacturing conditions and conversion processing without redundancy is enabled.

Further, in the analog-digital converter according to the present invention, it is preferable for the digital signal output unit to output the digital signal as a binary digital signal using the estimated value of β. It is possible for the analog-digital converter to transmit a binary digital signal, not a β-adic digital signal, to another device.

Further, in the analog-digital converter according to the present invention, it is preferable for the β estimator to convert an estimation input CD signal that can be converted into two digital signals into two digital signals, i.e., a first estimation β-adic digital signal whose value of the most significant bit is 1 and a second estimation β-adic digital signal whose value of the most significant bit is 0 and to estimate the value of β by minimizing the difference between the first estimation β-adic digital signal and the second estimation β-adic digital signal. It is possible for the analog-digital converter to estimate the value of β so that the error is the smallest.

Further, in the analog-digital converter according to the present invention, it is preferable for the β estimator to estimate the value of β using a lookup table that specifies values related to powers of β corresponding to a plurality of values of β and a plurality of exponents of the value of β for each value of β. It is possible for the analog-digital converter to reduce the circuit scale of the β estimator.

Further, in the analog-digital converter according to the present invention, it is preferable for the maximum value of the exponents specified in the lookup table to be specified so that the resolution in the case where the value of β is the value in the worst-case design is substantially equal to the predetermined resolution. It is possible for the analog-digital converter to obtain a necessary resolution even in the worst-case design and estimation processing without redundancy is enabled.

Further, in the analog-digital converter according to the present invention, it is preferable for the predetermined calculation to be performed as follow. In the case where the magnitude of the first analog signal is smaller than a threshold value, a first reference signal $V_{ref}$ multiplied by the value of β from which 1 is subtracted is added to the value of the fist analog signal multiplied by β, and in the case where the magnitude of the first analog signal is larger than a threshold value, a second reference signal $-V_{ref}$ multiplied by the value of β from which 1 is subtracted is added to the value of the first analog signal multiplied by β.

Further, in the analog-digital converter according to the present invention, it is preferable for the multiplying digital-analog converter to have two capacitors having different capacitance values and an operational amplifier connected to the capacitors via a switch.

It is possible for the analog-digital converter to calculate the amplitude degree of β with a simple circuit configuration.

Further, in the analog-digital converter according to the present invention, it is preferable for the value of β in the worst-case design to be less than 2 and for the worst-case value of β to be a value close to 2. It is possible for the analog-digital converter to reduce the number of bits necessary to estimate the value of β and at the same time, to reduce the number of bits of the β-adic digital signal necessary to obtain the resolution equivalent to that of the binary digital signal.

Further, in the pipeline type analog-digital converter according to the present invention, it is preferable:

for the β estimator to estimate the value of β using two β-adic digital signals having a predetermined number of bits acquired by converting the same input signal; and for the number of the plurality of digital approximators to be specified so that the resolution in the case where the value of β is the value in the worst-case design is substantially equal to the predetermined resolution. It is possible for the analog-digital converter to obtain a necessary resolution even in the worst-case design and estimation processing without redundancy is enabled.

Further, in the pipeline type analog-digital converter according to the present invention, it is preferable for the β estimator to estimate the values of β of the several digital approximators that calculate the higher-order bits of the digital signal and not to estimate the values of β of the other digital approximators. It is possible for the analog-digital converter to reduce the amount of estimation processing, since only the values of β of the high-order bits that require a high accuracy of the value of β are estimated.

Further, a method of another embodiment according to the present invention is a method for estimating a value of an amplification degree of β of an analog-digital converter including a multiplying digital-analog converter the amplification degree of which is β and having a predetermined resolution, the method comprising the steps of:

inputting the same input signal to the analog-digital converter;

converting the input signal into two β-adic digital signals; and estimating the value of the amplification degree of β based on the plurality of converted β-adic digital signals, wherein the value of β is a value larger than 1 and smaller than 2, and the number of bits of the plurality of converted β-adic digital signals is specified so that the resolution in the case where the value of β is the value in the worst-case design is substantially equal to the predetermined resolution.

Further, in the method according to the present invention, it is preferable:

for the analog-digital converter to further have a lookup table that specifies values related to powers of β corresponding to the plurality of values of β and a plurality of exponents of the value of β for each value of β; and for the maximum value of the exponents specified in the lookup table to be specified so that the resolution in the case where the value of β is the value in the worst-case design is substantially equal to the predetermined resolution.

Further, in the method according to the present invention, it is preferable:

for the analog-digital converter to be of pipeline type in which a plurality of digital approximators is connected in series to an input terminal; and for the number of digital approximators to be specified so that the resolution in the case where the value of β is the value in the worst-case design is substantially equal to the predetermined resolution.

Effect of the invention

According to the present invention, it is possible to provide an AD converter with less erroneous operations caused by the variations in the manufacturing conditions, etc., since the AD converter has a β estimator configured to estimate the value of β.

BRIEF DESCRIPTION OF THE DRAWINGS

FIG. 13 is a diagram illustrating an example of a lookup table.

FIG. 17B is a diagram illustrating a circuit of a conventional pipeline type AD converter.

EMBODIMENTS

Hereinafter, AD converters of embodiments according to the present invention are explained in detail with reference to the drawings. It should be understood that the drawings provided in the disclosure of the present invention are intended for explanation of the present invention and not intended to illustrate a proper scaling. In each of the drawings, the same or like symbol is attached to the component having the same or like function. Thus, in some cases, the component having the same or like function as that of the component explained previously is not explained again.

Hereinafter, AD converters of some embodiments according to the present invention are explained in detail with reference to FIGS. 1 to 15.

Figure 1:
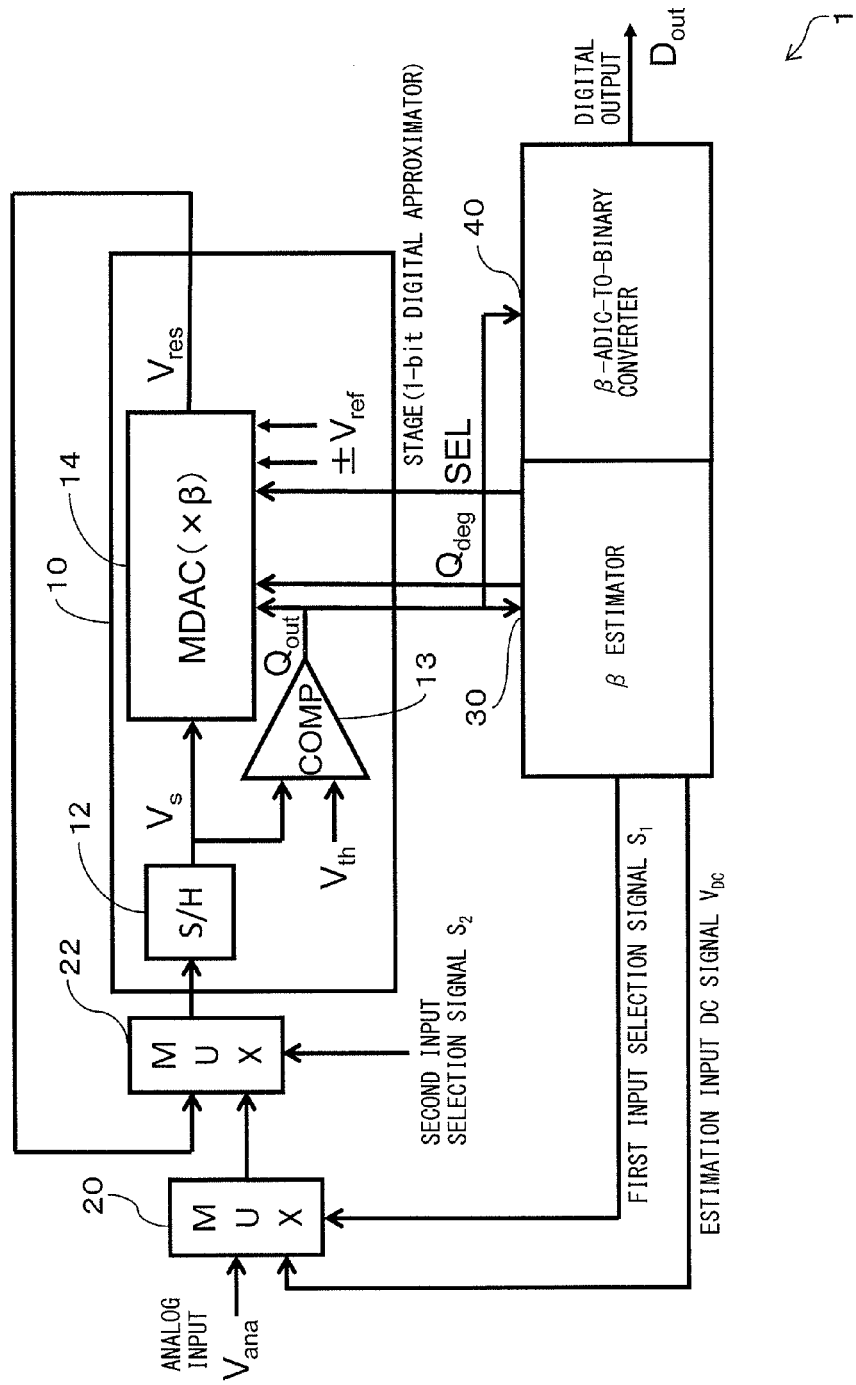
FIG. 1 is a diagram schematically illustrating a block of an AD converter of a first embodiment according to the present invention.

First, with reference to FIGS. 1 to 10, an AD converter of a first embodiment according to the present invention is explained. FIG. 1 is a diagram schematically illustrating a cyclic type AD converter 1 of the first embodiment according to the present invention.

Figure 17A:
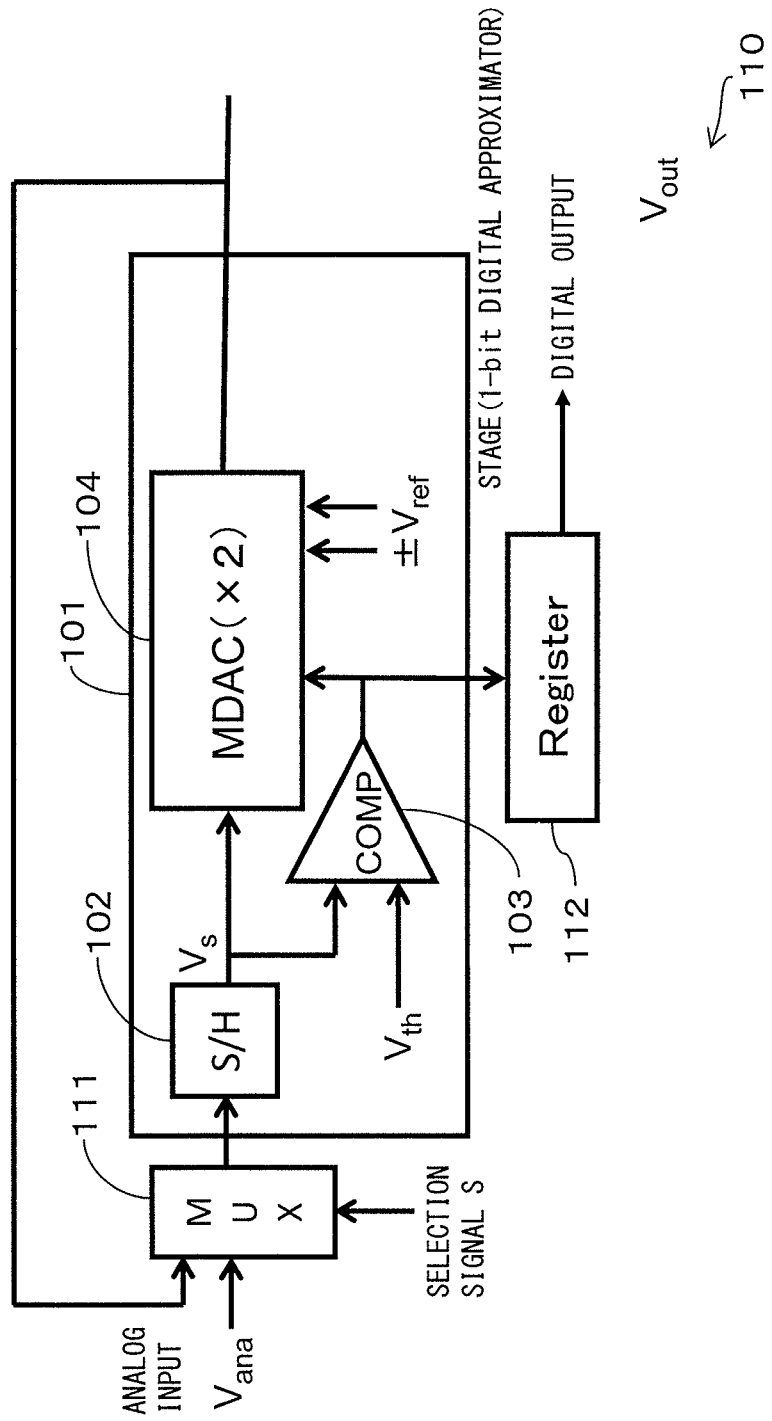
FIG. 17A is a diagram illustrating a circuit of a conventional cyclic type AD converter.
Figure 18A:
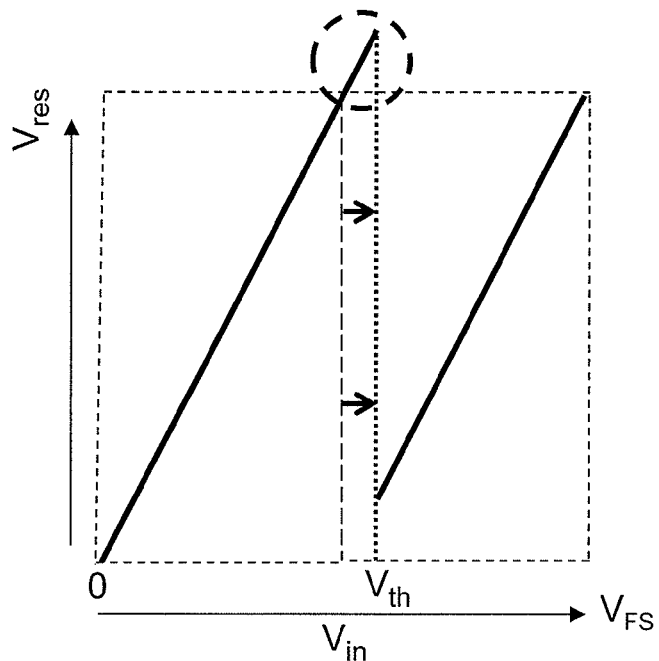
FIG. 18A is a diagram illustrating an example of the erroneous operation of the conventional AD converter.
Figure 18B:
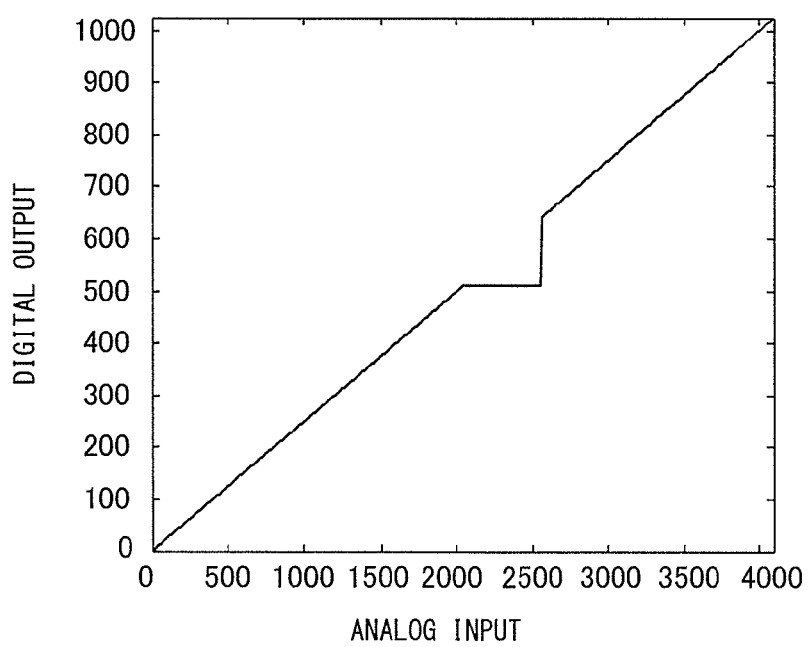
FIG. 18B is a diagram illustrating an example of the erroneous operation of the conventional AD converter.
Figure 18C:
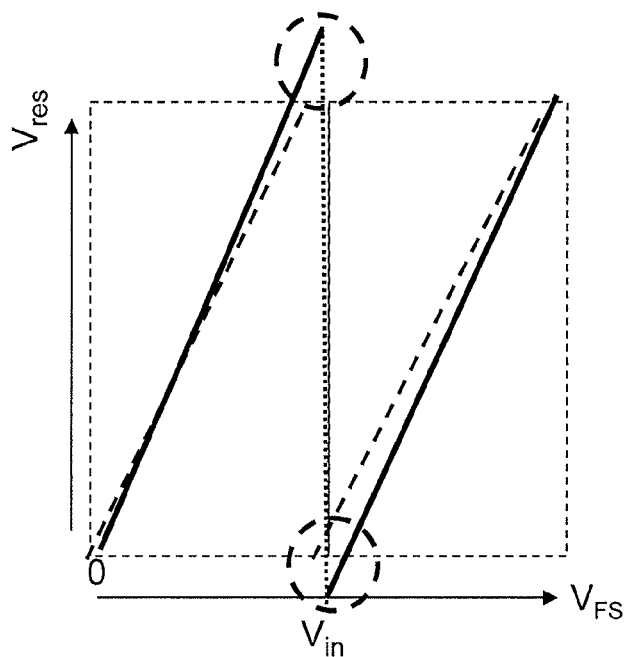
FIG. 18C is a diagram illustrating an example of the erroneous operation of the conventional AD converter.
Figure 18D:
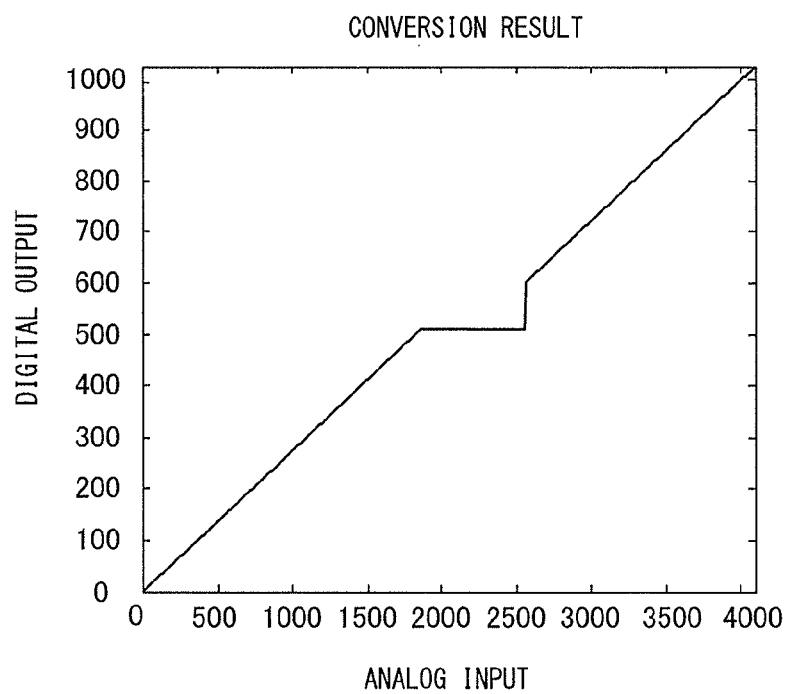
FIG. 18D is a diagram illustrating an example of the erroneous operation of the conventional AD converter.
Figure 18E:
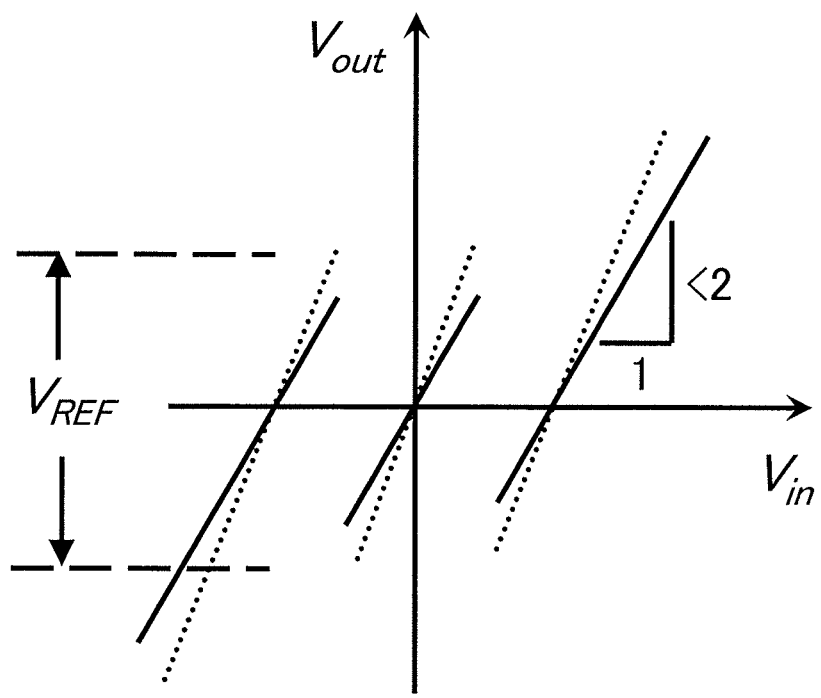
FIG. 18E is a diagram illustrating an example of the erroneous operation of the conventional AD converter.
Figure 18F:
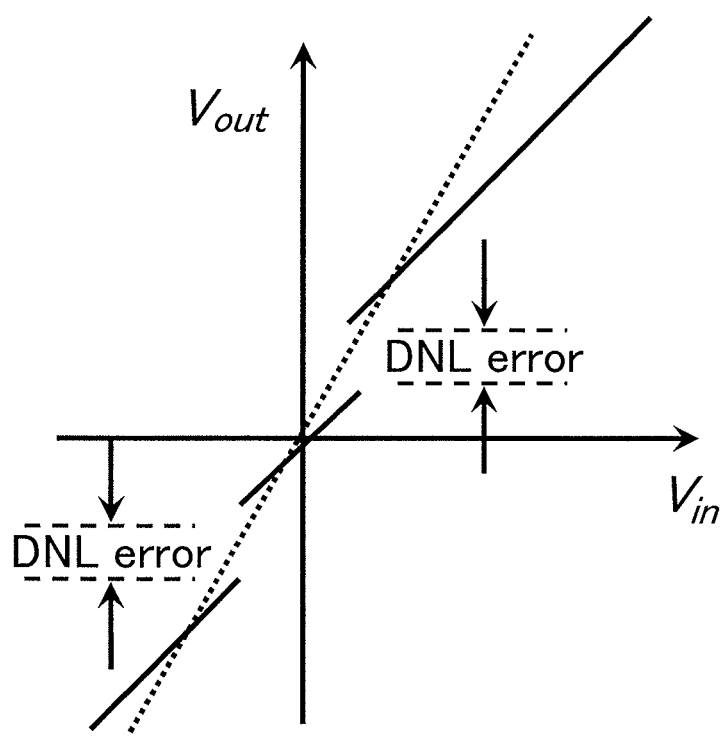
FIG. 18F is a diagram illustrating an example of the erroneous operation of the conventional AD converter.
Figure 19:
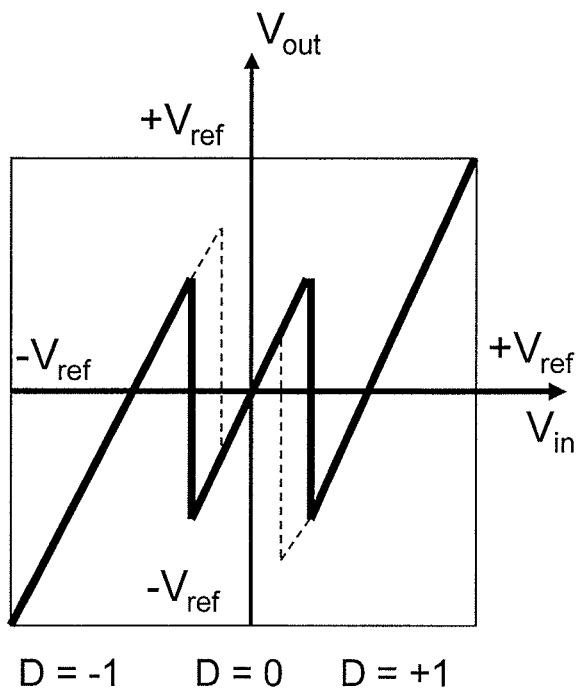
FIG. 19 is a diagram illustrating an example of the input/output characteristics of the conventional digital approximator.

As illustrated in FIG. 1, the cyclic type AD converter 1 has a digital approximator 10, multiplexers 20 and 22, a β estimator 30, and a β-adic-to-binary converter 40. The multiplexer 20 is configured to select an analog input signal $V_{ana}$ and an estimation input DC signal $V_{DC}$ input from the β estimator 30 based on a first input selection signal $S_1$ from the β estimator 30. The multiplexer 22 is configured to form a feedback circuit by selecting the analog input signal $V_{ana}$ or the estimation input DC signal $V_{DC}$ only at the time of AD conversion for the digital approximator 10 to obtain a digital code of the MSB and by selecting an output signal of the digital approximator 10 at the time of AD conversion to obtain a digital code of a bit other than the MSB based on a second input selection signal $S_2$ generated based on a sequence of the operation in a logic circuit, etc. In other words, the cyclic type AD converter 1 is changed from a conventional cyclic type AD converter 110 illustrated in FIG. 17A by adding the multiplexer 20 and the β estimator 30 to make it possible to estimate the value of β in the digital approximator 10.

The digital approximator 10 includes a unit 12 having the sample/hold function to generate a sampling signal $V_s$ by sampling and holding an analog signal that is input, a comparator 13 configured to compare the sampling signal $V_s$ and a threshold value $V_{th}$ and to output a digital value $Q_{out}$ indicative of the comparison result, and an MDAC 14 configured to amplify the sampling signal $V_s$ by a factor of β and at the same time, to generate a residual signal $V_{res}$ by performing a calculation in accordance with the comparison result of the comparator 13. The value of an amplification degree of β in the DMAC 14 is a value larger than 1 and smaller than 2. The comparator is configured to output 1 as the digital value $Q_{out}$ in the case where the sampling signal $V_s$ is greater than the threshold value $V_{th}$ and to output 0 as the digital value $Q_{out}$ in the case where the sampling signal $V_s$ is smaller than the threshold value $V_{th}$. The calculation processing in the MDAC 14 is explained in detail with reference to FIGS. 2 to 5.

Figure 2:
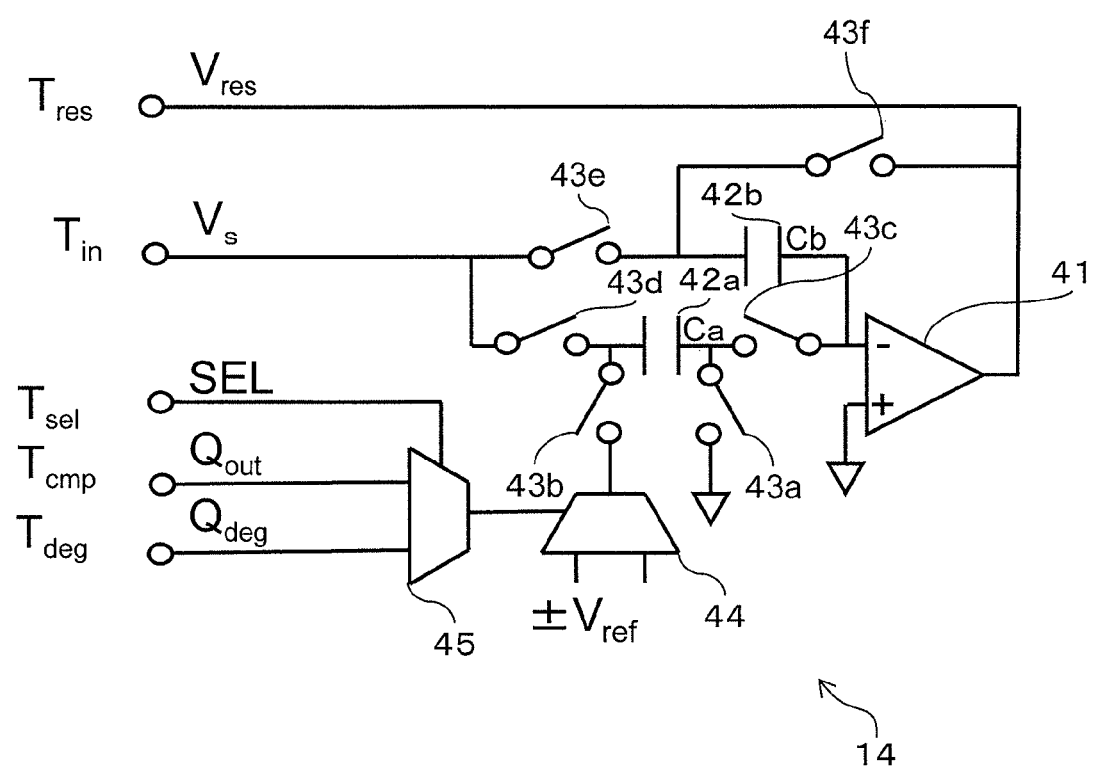
FIG. 2 is a diagram illustrating a detailed circuit of an MDAC illustrated in FIG. 1.

FIG. 2 is a diagram illustrating an example of a detailed circuit of the MDAC 14. The MDAC 14 has an input terminal $T_{in}$ to receive an input signal, an input terminal $T_{cmp}$ to receive an output signal of the comparator 13, an input terminal $T_{deg}$ to receive a digital value from the β estimator 30, an input terminal $T_{sel}$ to receive a selection signal SEL input from the β estimator 30, and an input terminal $T_{res}$ to output the calculation result to the multiplexer 22. Further, the MDAC 14 has an operational amplifier 41, capacitors 42a and 42b, switches 43a to 43f, and multiplexers 44 and 45.

The MDAC 14 amplifies the sampling signal $V_s$ by a factor of β by switching the switches 43a to 43f in accordance with a desired operation sequence and at the same time, performs a calculation in accordance with the comparison result of the comparator 13. Switching function of the switches 43a to 43f is implemented by a logic circuit, etc., which is configured to operate in accordance with a desired operation sequence. For example, in the case where the switches 43a to 43f are configured by field effect transistors, such as NMOS and CMOS, switching function is implemented by controlling the turning on/off operation between the source and drain by controlling the gate signal. The value of the amplification degree of β of the sampling signal $V_s$ is determined by appropriately selecting the capacitances of the capacitors 42a and 42B. The capacitors 42a and 42b are configured by two wire layers, etc., of a semiconductor device, respectively, and have the capacitance values indicated by $C_a$ and $C_b$. The multiplexer 44 selects which of reference signals ±$V_{ref}$ to input based on the signal received from the comparator 13. The reference signal +$V_{ref}$ corresponds to a full-scale signal $V_{FS}$ in the case where AD conversion is carried out with unipolar code and the reference signal −$V_{ref}$ corresponds to a zero input. In the case where AD conversion is carried out with bipolar code, each of the ±$V_{ref}$ has a value half the full-scale value. Which of the input signal $Q_{deg}$ at the input terminal $T_{deg}$ and the input signal $Q_{out}$ at the input terminal $T_{cmp}$ is input based on the selection signal SEL received from the β estimator 30 is selected by the multiplexer 45.

Figure 3:
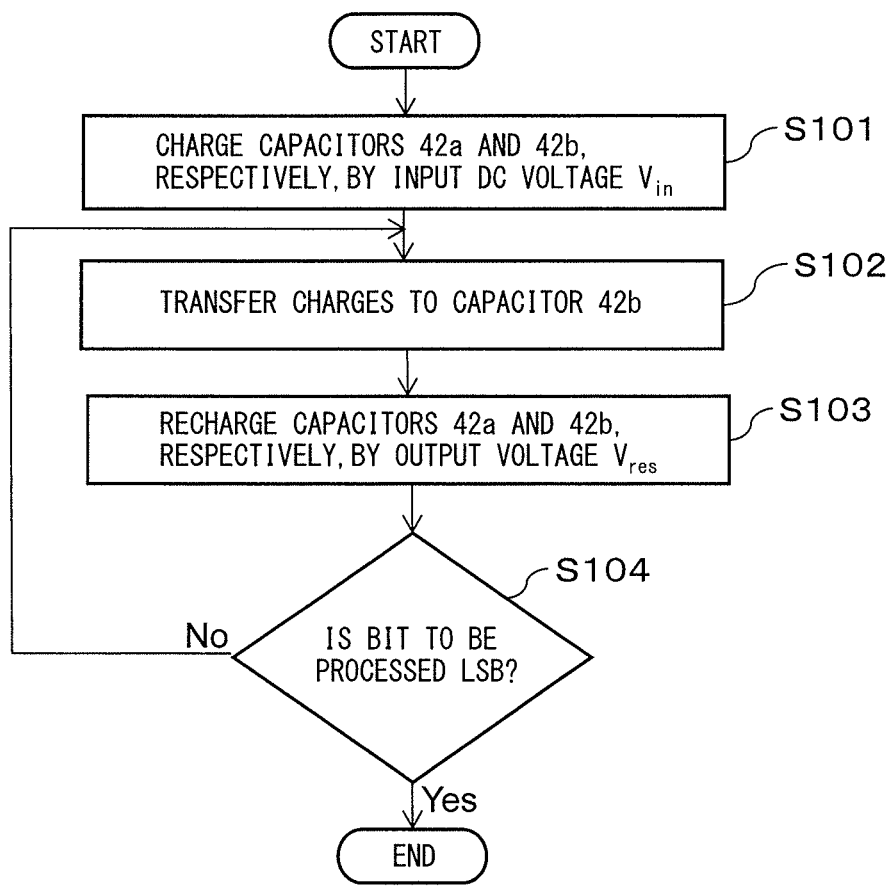
FIG. 3 is a diagram illustrating a sequence of the operation of the MDAC illustrated in FIG. 2.
Figure 4A:
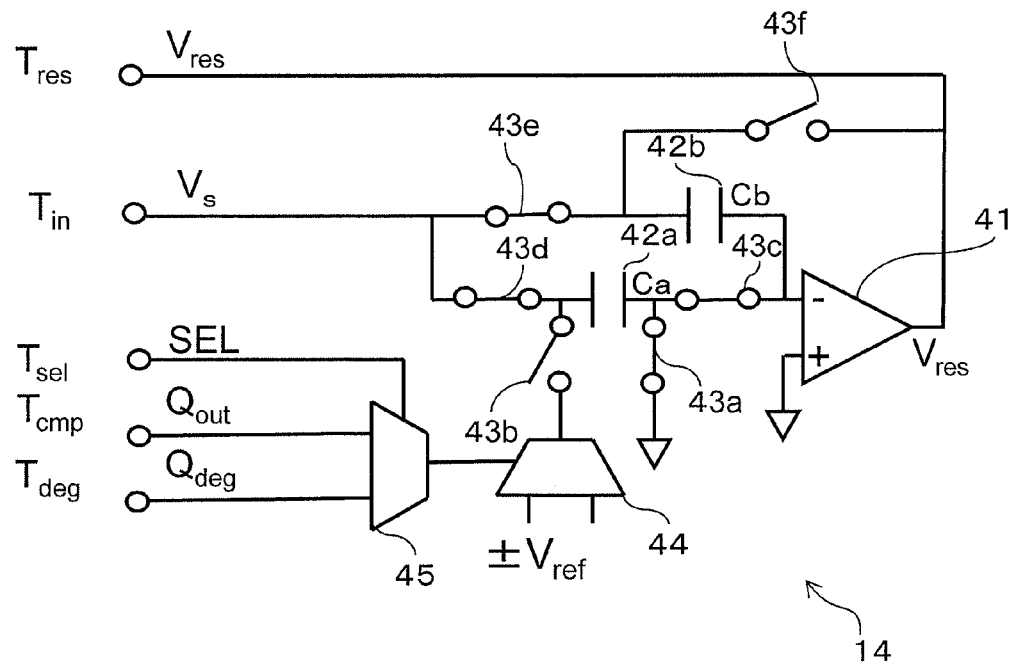
FIG. 4A is a diagram illustrating the sequence of the operation of the MDAC illustrated in FIG. 2.
Figure 4B:
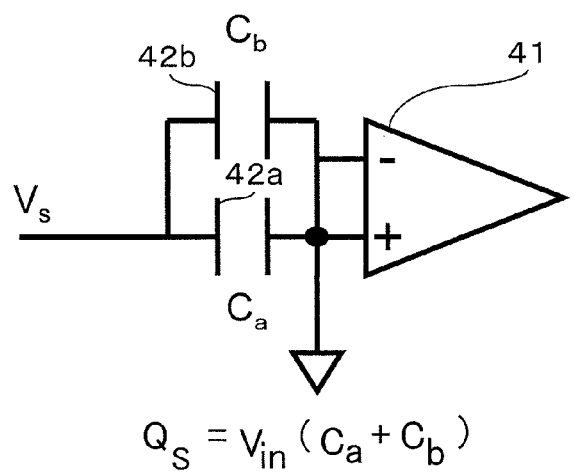
FIG. 4B is a diagram illustrating an equivalent circuit of the circuit illustrated in FIG. 4A.
Figure 4C:
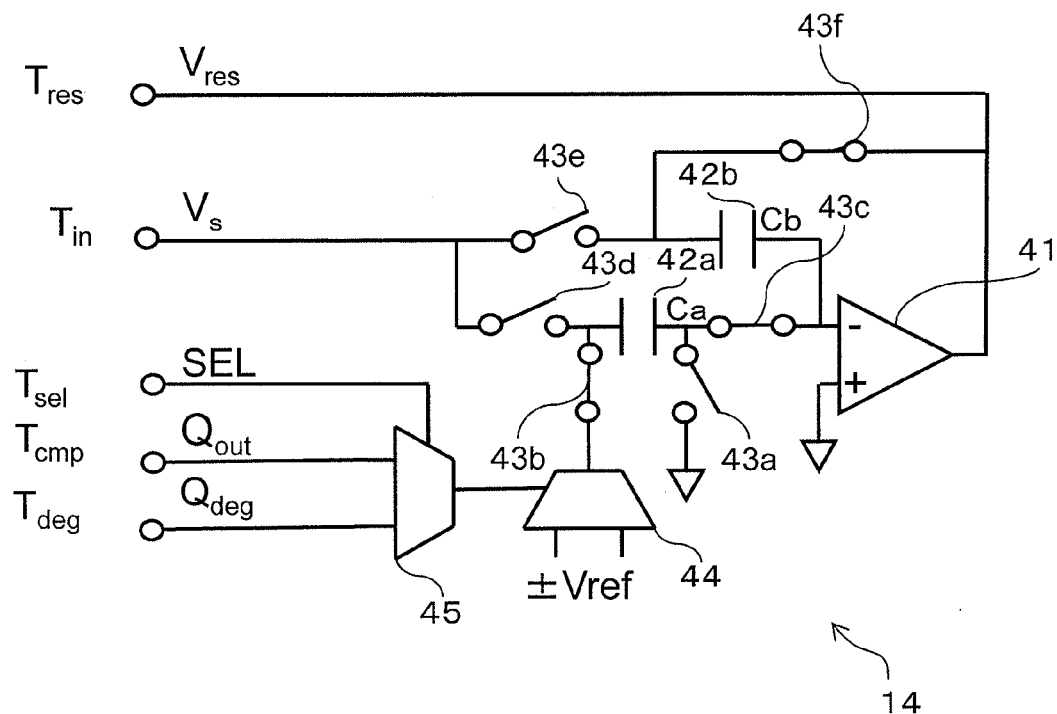
FIG. 4C is a diagram illustrating the sequence of the operation of the MDAC illustrated in FIG. 2.
Figure 4D:
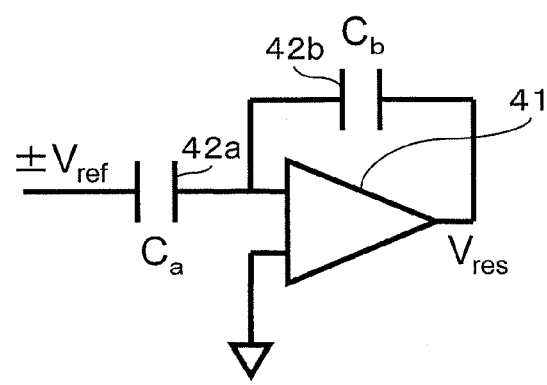
FIG. 4D is a diagram illustrating an equivalent circuit of the circuit illustrated in FIG. 4C.
Figure 4E:
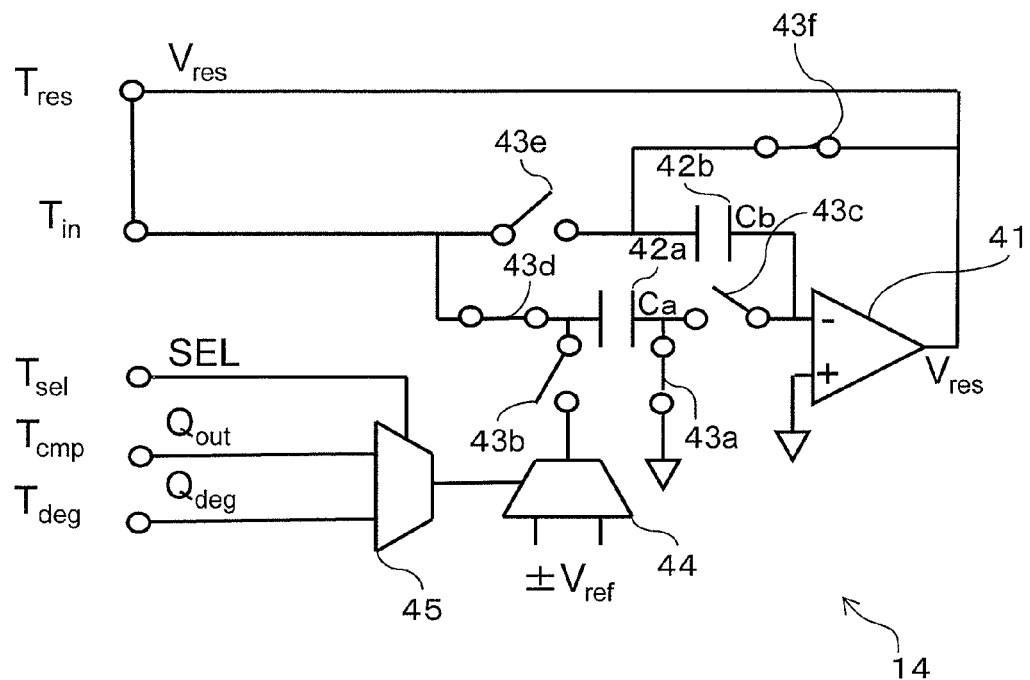
FIG. 4E is a diagram illustrating the sequence of the operation of the MDAC illustrated in FIG. 2.
Figure 4F:
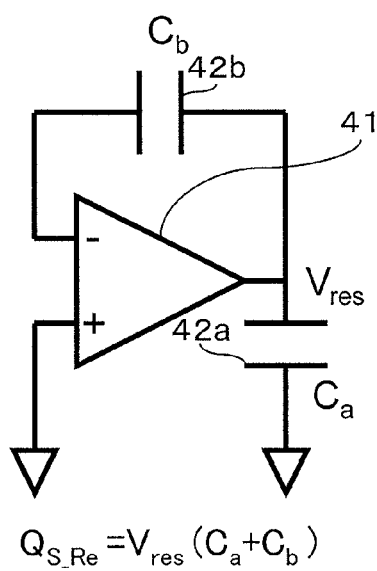
FIG. 4F is a diagram illustrating an equivalent circuit of the circuit illustrated in FIG. 4E.
Figure 5:
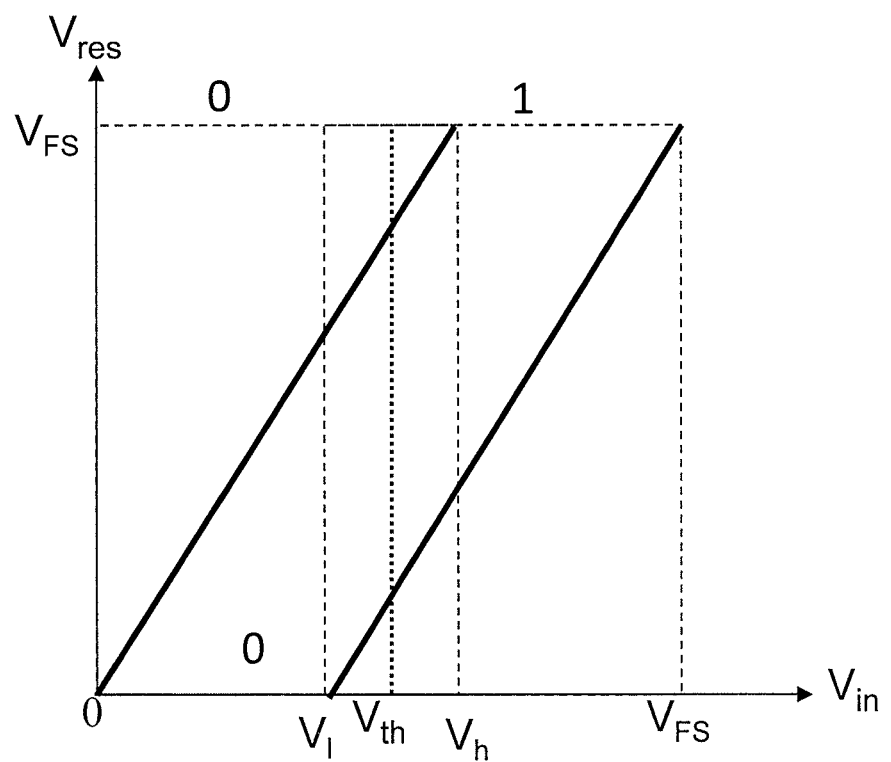
FIG. 5 is a diagram illustrating an example of the input/output characteristics of a digital approximator.

Hereinafter, with reference to FIGS. 3 to 5 in order, a calculation processing flow of the MDAC 14 is explained. FIG. 3 is a diagram illustrating a flow of the operation of the MDAC 14 and FIGS. 4A to 4F are diagrams each illustrating a sequence of the operation of the MDAC 14. FIG. 5 is a diagram illustrating an example of the input/output characteristics of the digital approximator 10.

First, at step S101 illustrated in the flow in FIG. 3, the MDAC 14 charges the capacitors 42a and 42b, respectively, by applying the input signal $V_{in}$ to the input terminal $T_{in}$. FIG. 4A illustrates a state of the switches at step S101. As illustrated in FIG. 4A, the switches 43a, 43c, and 43d are in the on state the switches 43b and 43f are in the off state. The capacitors 42a and 42b are charged via the switches 43d and 43e, respectively, by bringing the switches into these states, respectively, by the sampling signal $V_s$ applied to the input terminal $T_{in}$. FIG. 4B is a diagram illustrating an equivalent circuit of the switching state illustrated in FIG. 4A. As illustrated in FIG. 4B, in the state at step S101, a charge amount $Q_s$ charged in the capacitors 42a and 42b is $$Q_s = V_{in}(C_a + C_b) \qquad (3).$$

Next, at step S102 shown in the flow in FIG. 3, the MDAC 14 transfers charges to the capacitor 42b. FIG. 4C illustrates the state of the switches at step S102. As illustrated in FIG. 4C, the switches 43b, 43c, and 43f are in the on state and the switches 43a, 43d, and 43e are in the off state. One of the reference signals ±$V_{res}$ is applied to the capacitor 42a via the switch 43b, by bringing the switches into these states, respectively. FIG. 4D is a diagram illustrating an equivalent circuit of the switching state illustrated in FIG. 4C. As illustrated in FIG. 4D, in the state at step S102, a charge amount $Q_T$ charged in the capacitors 42a and 42b is $$Q_T = C_a(\pm V_{res}) + C_b \cdot V_{res} \qquad (4).$$

Next, at step S103 shown in the flow in FIG. 3, the MDAC 14 recharges the capacitors 42a and 42b, respectively, by producing the residual signal $V_{res}$ at the input terminal $T_{res}$. FIG. 4E illustrates the state of the switches at step S103. As illustrated in FIG. 4E, the switches 43a, 43d, and 43f are in the on state and the switches 43b, 43c, and 43e are in the off state. the capacitors 42a and 42b are recharged via the switches 43d and 43f by the residual signal $V_{res}$ applied to the input terminal $T_{in}$ via the multiplexer 22, by bringing the switches into these states, respectively. FIG. 4F is a diagram illustrating an equivalent circuit of the switching state illustrated in FIG. 4E. As illustrated in FIG. 4F, in the state at step S103, a charge amount $Q_{S\_Re}$ charged in the capacitors 42a and 42b is $$Q_{S\_Re} = V_{res}(C_a + C_b) \qquad (5)$$

Then, at step S104 shown in the flow in FIG. 3, the MDAC 14 determines whether the bit to be processed is the least significant bit (hereinafter, also referred to as LSB) or not. In the case where the bit to be processed is not the LSB, the MDAC 14 returns to step S102 and performs the processing at steps S102 and S103 again. In the case where the bit to be processed is the LSB, the MDAC 14 ends the processing.

It is possible for the MDAC 14 to amplify the signal applied to the input terminal $T_{in}$ by a factor of β, by performing the flow illustrated in FIG. 3. A relationship of $$Q_T = Q_S \qquad (6)$$

is held between the expressions (3) and (4), by the law of conservation of charge. Thus, the right side of the expression (3) and that of the expression (4) become equal $$V_{in}(C_a + C_b) = C_a(\pm V_{res}) + C_b \cdot V_{res} \qquad (7).$$

By developing expression (7), $$V_{res} = \frac{C_a + C_b}{C_b} V_{in} \pm \frac{C_a}{C_b} V_{ref} \qquad (8)$$

is obtained. If $$\beta = \frac{C_a + C_b}{C_b} \qquad (9)$$

is assumed, $$V_{res} = \beta V_{in} \pm (\beta - 1) V_{rel} \qquad (10)$$

is obtained. Thus, by selecting the capacitance values $C_a$ and $C_b$ of the capacitors 42a and 42b so as to satisfy a relationship of $$C_a < C_b \tag{11}$$

it is possible to select a value larger than 1 and smaller than 2 as the value of $\beta$.

As described above, it is possible for the MDAC 14 to amplify the signal applied to the input terminal $T_{in}$ by a factor of $\beta$, by performing the flow illustrated in FIG. 3. For the second and subsequent bits, it is possible to find the value $\beta$ times the residual signal similarly based on the law of conservation of charge from the relationship of the expressions (4) and (5).

FIG. 5 illustrates an example of the input/output characteristics of the digital approximator 10. As described above, in the AD converter 1, the value of the amplification degree of $\beta$ is a value larger than 1 and smaller than 2, and therefore a specific region between $V_l$ and $V_h$ including the threshold value $V_{th}$ has the two digital signals $D_{out}$ for the one input signal $V_{in}$ as a result. Thus, the input signal $V_{in}$ has two digital output signals in the region between $V_l$ and $V_h$, i.e., a digital output signal whose MSB is 1 and a digital output signal whose MSB is 0 as a result.

Figure 6:
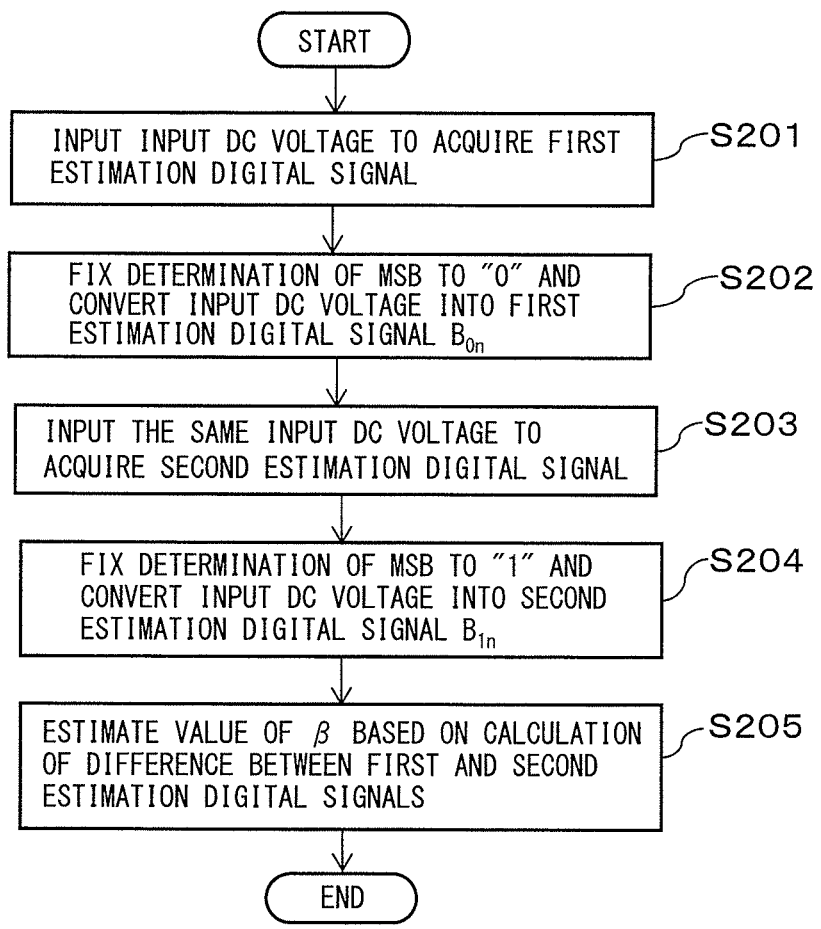
FIG. 6 is a diagram illustrating an example of a flow to estimate the value of β.

With reference to FIG. 1 again, the $\beta$ estimator 30 is explained, which is another component of the AD converter 1 of the first embodiment according to the present invention. The $\beta$ estimator 30 has the function to estimate the value of the amplification degree of $\beta$ in the MDAC 14. The value of $\beta$ differs for each semiconductor device as a result, since the capacitors 42a and 42b and the amplification degree of the operational amplifier 41 vary due to the variations in the manufacturing conditions. The $\beta$ estimator 30 is configured by hardware or software which has the function to estimate the value of $\beta$ or by a combination of hardware and software. For example, it is possible to configure the $\beta$ estimator 30 by a calculation unit configured by a plurality of transistors, or a memory storing software, or by a combination of a calculation unit and a memory. Further, the $\beta$ estimator 30 may be incorporated in an MPU (not illustrated) mounted on a semiconductor device. With reference to FIG. 6, the estimation method of the value of $\beta$ by the $\beta$ estimator 30 is explained. FIG. 6 is a diagram illustrating a flow for the $\beta$ estimator 30 to estimate the value of $\beta$. The $\beta$ estimator 30 estimates the value of $\beta$ by converting the estimation input DC signal $V_{DC}$ into two $\beta$-adic digital signals whose MSB is "0" and "1", respectively. Hereinafter, in accordance with the flow illustrated in FIG. 6, the flow for the $\beta$ estimator 30 to estimate the value of $\beta$ is explained in detail.

First, at step S201, the $\beta$ estimator 30 inputs the estimation input DC signal $V_{DC}$ to the digital approximator 10 by appropriately selecting the first and second input selection signals $S_1$ and $S_2$ input to the multiplexers 20 and 22, respectively, in order to acquire a first estimation digital signal. The estimation input DC signal that is input is a value included in the range between $V_l$ and $V_h$ illustrated in FIG. 5 and a value having the two digital output signals $D_{out}$ for one input signal $V_{in}$. In the case where AD conversion is carried out with bipolar code, it is preferable to use an intermediate voltage $V_{CM}$ at the full-scale input level, which is the same as that of the threshold value $V_{th}$, as the estimation input DC signal. In the case where AD conversion is carried out with bipolar code, the intermediate voltage $V_{CM}$ becomes equal to the direct-current difference voltage 0V. In the AD converter 1, the estimation input DC signal $V_{DC}$ is input from the $\beta$ estimator 30, however, it may also be possible to design a configuration in which the estimation input DC signal $V_{DC}$ is input from an external circuit of the AD converter 1, not from the $\beta$ estimator 30.

Next, referring to FIG. 6 again, at step S202, the $\beta$ estimator 30 fixes the determination of the MSB to "0", converts the estimation input DC signal into a $\beta$-adic digital signal, and stores the $\beta$-adic digital signal in the $\beta$ estimator 30 as a first estimation digital signal $b_{0n}$. The first estimation digital signal is the estimation input DC signal $V_{DC}$ converted into a digital signal whose MSB is "0". The fixing of the determination of the MSB to "0" can be carried out by selecting the multiplexer 45 of the MDAC 14 illustrated in FIG. 2 so as to output the input signal $Q_{deg}$ at the input terminal $T_{deg}$ based on the selection signal SEL received from the $\beta$ estimator 30 and by calculating the MSB with the input level at the input terminal $T_{deg}$ fixed to "0". When calculating the second and subsequent bits, as in the normal operation, the multiplexer 45 is selected so as to output the input signal $Q_{out}$ at the input terminal $T_{cmp}$.

Next, referring to FIG. 6 again, at step S203, the $\beta$ estimator 30 inputs the DC signal $V_{DC}$ to the digital approximator 10 via the multiplexers 20 and 22 in order to acquire the second estimation digital signal. The estimation input DC signal $V_{DC}$ input at this time is the same as the estimation input DC signal $V_{DC}$ at step S201.

Next, at step S204, the $\beta$ estimator 30 fixes the determination of the MSB to "1", converts the estimation input DC signal $V_{DC}$ into a $\beta$-adic digital signal, and stores the $\beta$-adic digital signal in the $\beta$ estimator 30 as a second estimation digital signal $b_{1n}$. The fixing of the determination of the MSB to "1" can be carried out by selecting the multiplexer 45 of the MDAC 14 illustrated in FIG. 2 so as to output the input signal $Q_{deg}$ at the input terminal $T_{deg}$ based on the selection signal SEL received from the $\beta$ estimator 30 and by calculating the MSB with the input level at the input terminal $T_{deg}$ fixed to "0". When calculating the second and subsequent bits, as in the normal operation, the multiplexer 45 is selected so as to output the input signal $Q_{out}$ at the input terminal $T_{cmp}$.

Then, referring to FIG. 6 again, at step S205, the $\beta$ estimator 30 calculates the value of $\beta$ with which a value (e) ($\beta$) of the difference between the first estimation digital signal $b_{0n}$ and the second estimation digital signal $b_{1n}$ stored in the $\beta$ estimator 30 is the smallest. Specifically, the $\beta$ estimator 30 finds the value of $\beta$ with which the absolute value of the value ($\beta$) of the difference between the first and second estimation digital signals $b_{0n}$ and $b_{1n}$ by sequentially substituting a plurality of values of $\beta$ in $$e(\beta) = \sum_{n=1}^{M} b_{1n}\beta^{-n} - \sum_{n=1}^{M} b_{0n}\beta^{-n} \tag{12}$$

The estimation input DC signal $V_{DC}$ is a value in the region having two digital output signals, i.e., the digital output signal the MSB of which is 1 and the digital output signal the MSB of which is 0 and the first estimation digital signal $b_{0n}$ converted at step S202 and the second estimation digital signal $b_{1n}$ converted at step S204 are signals obtained by converting the same estimation input DC signal $V_{DC}$, and therefore it is estimated that the value of $\beta$ with which the absolute value of e ($\beta$) is the smallest is a desired value of $\beta$.

Figure 7:
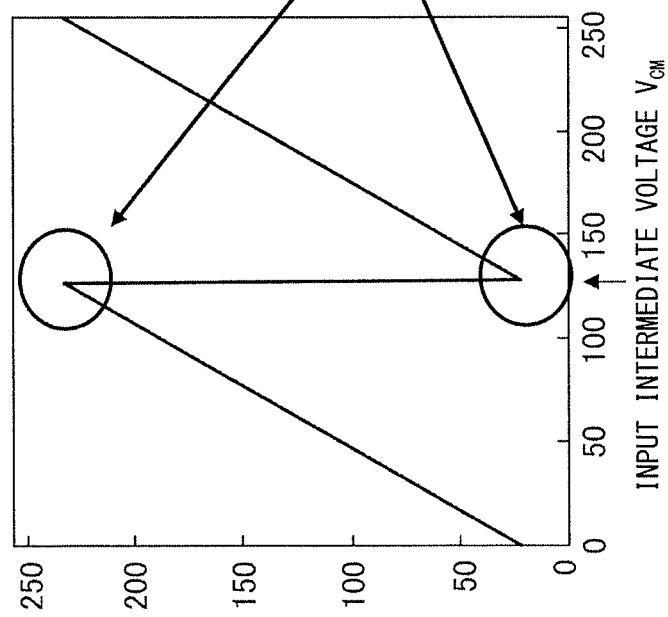
FIG. 7 is a diagram illustrating an example of estimation of the value of β.

FIG. 7 illustrates an example of estimation of the value of $\beta$ by the $\beta$ estimator 30. In the example in FIG. 7, the estimation input DC signal $V_{DC}$ is the intermediate voltage $V_{CM}$ and the value of β is 1.8. In this case, the first estimation digital signal $b_{0n}$ and the second estimation digital signal $b_m$ will be $$b_{0n} = \beta^{-2} + \beta^{-3} + \beta^{-4} + \beta^{-6} + \beta^{-8} + \beta^{-9} + \beta^{-11} + \beta^{-12} + \beta^{-13} + \beta^{-16} + \beta^{-17} + \beta^{-18} \quad (13) \text{ and}$$

$$b_{1n} = \beta^{-1} + \beta^{-4} + \beta^{-5} + \beta^{-7} + \beta^{-8} + \beta^{-10} + \beta^{-12} + \beta^{-13} + \beta^{-14} + \beta^{-16} + \beta^{-18} + \beta^{-19} \quad (14),$$

respectively.

Figure 8:
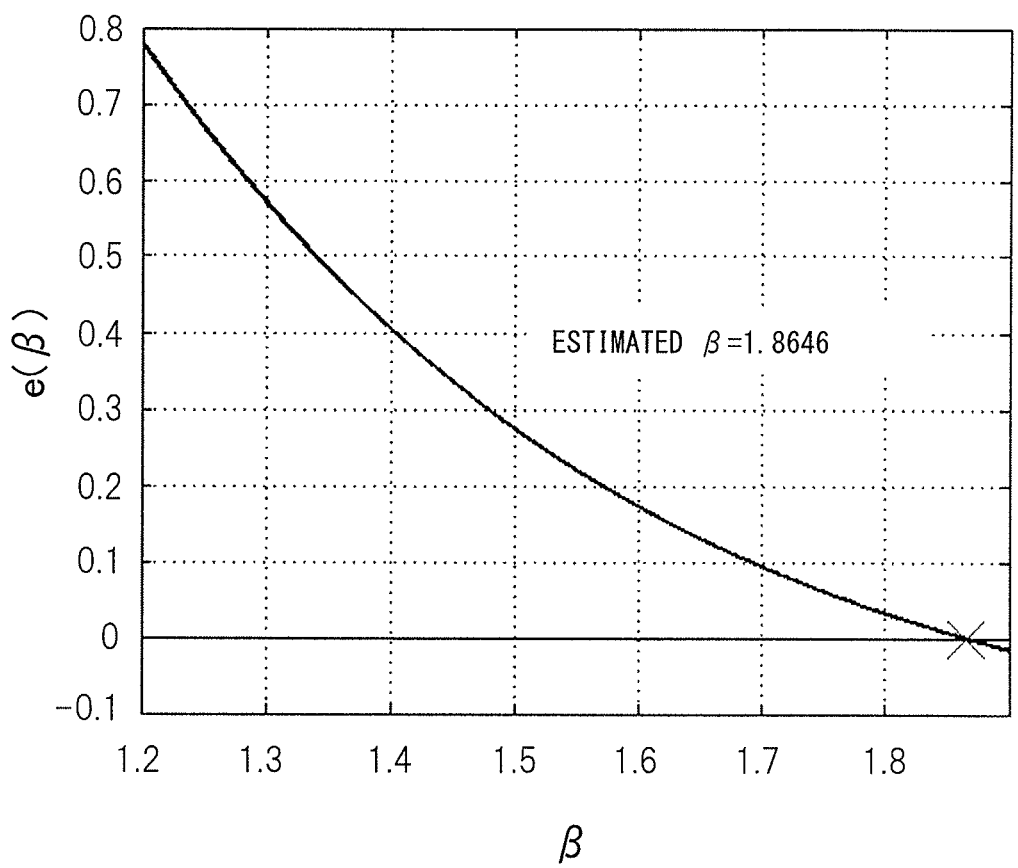
FIG. 8 is a diagram illustrating a verification result of an estimation method according to the present invention.

FIG. 8 is a diagram illustrating the result of verification of the estimation method of the value of β using the AD converter 1 illustrated in FIG. 1. In the verification illustrated in FIG. 8, the ratio between the capacitance value $C_a$ of the capacitor 42a and the capacitance value $C_b$ of the capacitor 42b is 0.9:1.0, and therefore the setting value of the value of β by the capacitor ratio will be 1.9. Further, an open loop gain A of the operational amplifier 41 is assumed to be 100, and therefore in the case where the open loop gain A is taken into consideration, an effective β' of the value of β will be $$\beta' = \frac{\beta}{1 + \frac{\beta}{A}} = 1.86457 \quad (15)$$

On the other hand, as illustrated in FIG. 8, it has been confirmed that the value of β is 1.8646 as the result of verification by sweeping the value of β from 1 to 2 with a search step width of 0.0001. As illustrated in FIG. 8, it has been confirmed that the present estimation method is an estimation method with a high accuracy by the verification. In the verification illustrated in FIG. 8, the value of β is swept from 1 to 2, however, it is preferable to estimate the value of β by sweeping the value of β in the variation range of β that is found by calculation or simulation having taken into consideration the designed value of β and the manufacturing variations.

Figure 9:
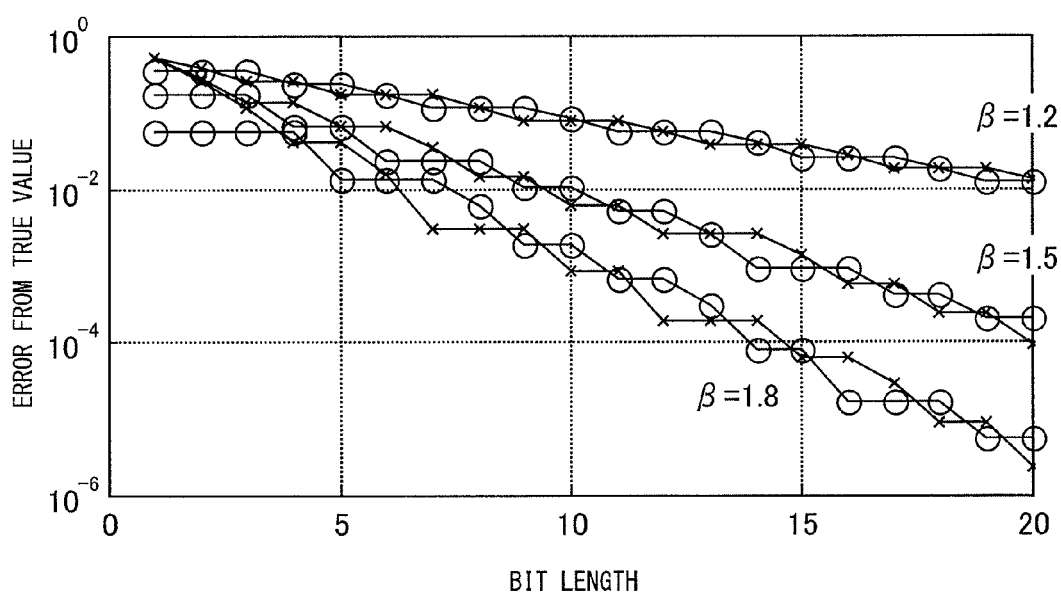
FIG. 9 is a diagram illustrating an example of an estimation result of the estimation method according to the present invention.

FIG. 9 is a diagram illustrating the result of estimation of the value of β by performing the estimation method according to the present invention using the AD converter 1 illustrated in FIG. 1. As illustrated in FIG. 9, in the case where the value of β is 1.8, if estimation is performed with the number of bits of 20, the difference between the first and second estimation digital signals $b_{0n}$ and $b_{1n}$ becomes as small as about $10^{-6}$. However, in the case where the value of β is 1.2, the difference between the first and second estimation digital signals $b_{0n}$ and $b_{1n}$ is about $10^{-2}$ and in the case where the value of β is 1.5, the difference between the first and second estimation digital signals $b_{0n}$ and $b_{1n}$ is about $10^{-4}$. Thus, it is possible to understand that the closer the value of β to 2, it is possible to estimate the value of β with the smaller number of bits. It is advantageous for the value of β to be close to 2 in the range not exceeding 2 also in the worst-case design, which is the maximum value or the minimum value due to the specifications of the AD converter 1, such as the power source voltage and the temperature range in which the AD converter 1 can be used, and the variations in the manufacturing conditions of the semiconductor device on which the AD converter 1 is mounted. It is possible to easily determine the worst-case design by carrying out a simulation by specifying various conditions, such as the variations in the manufacturing conditions of the semiconductor device.

It is preferable for the value of β in the worst-case design to be less than 2 and for the value of β to be a value close to 2. For example, in the case where the value of β in the worst-case design is included in the range of the variation of ±10% from the median of the design, it is preferable for the median of the design of the value of β to be 1.8. The reason is that the value of β in the worst-case design is 1.62 and 1.98, and therefore the maximum value is a value smaller than 2.

Further, the number of bits of the first and second estimation digital signals $b_{0n}$ and $b_{1n}$ may be specified so as to have a predetermined resolution even in the case where the value of β is the value in the worst-case design. In the AD converter 1, the smaller the value of β becomes, the larger the number of bits of the digital output signal $D_{out}$ necessary to obtain a predetermined resolution becomes. Thus, if the value of β becomes small due to the variations in the manufacturing conditions, etc., there is a possibility that a necessary resolution cannot be obtained with the number of bits of the digital output signal $D_{out}$ specified so that a predetermined resolution is obtained when the value of β is the median of the design. On the other hand, if the number of bits of the digital output signal $D_{out}$ is increased in order to increase the resolution, the amount of calculation processing to estimate the value of β increases.

When the β estimator 30 estimates the value of β using the first and second estimation digital signals $b_{0n}$ and $b_{1n}$ having a fixed number of bits, if the value of β becomes small due to the variations in the manufacturing conditions, etc., the resolution is reduced. Further, if the β estimator 30 increases the number of bits of the first and second estimation digital signals $b_{0n}$ and $b_{1n}$ more than necessary in order to increase the resolution, the amount of calculation processing to estimate the value of β increases. Thus, it is preferable for the β estimator 30 to specify the number of bits of the first and second estimation digital signals $b_{0n}$ and $b_{1n}$ so as to have a predetermined resolution even in the case where the value of β is the value in the worst-case design. Preferably, it is possible for the β estimator 30 to specify the number of bits of the first and second estimation digital signals $b_{0n}$ and $b_{1n}$ so that the resolution in the case where the value of β is the value in the worst-case design is substantially equal to the resolution specified in the case where the value of β is the median of the design. For example, it is preferable to specify the number of bits of the first and second estimation digital signals $b_{0n}$ and $b_{1n}$ so that in the case where the median of the design of the value of β is 1.8 and the values of the value of β in the worst-case design are 1.62 and 1.98, the resolution when the value of β is 1.62 is substantially equal to the resolution specified when the value of β is 1.8.

By the β estimator 30 specifying the number of bits of the first and second estimation digital signals $b_{0n}$ and $b_{1n}$ so as to have a predetermined resolution even in the case where the value of β is the value in the worst-case design, it is possible to obtain a necessary resolution even in the worst-case design and estimation processing without redundancy is enabled.

Referring to FIG. 1 again, the β-adic-to-binary converter 40, which is another component of the AD converter 1 of the first embodiment according to the present invention is explained. The β-adic-to-binary converter 40 is configured by hardware or software which has the function to sequentially taken in the β-adic digital signal output from the comparator and to output the β-adic digital signal as a binary digital output signal, or by a combination of hardware and software. For example, it is possible to configure the β-adic-to-binary converter 40 by a calculation unit including a register configured to store a β-adic digital signal and a plurality of transistors or a memory storing software, or a combination of the calculation unit and the memory. Further, the β-adic-to-binary converter 40 may be incorporated together with the β estimator 30 in an MPU (not illustrated) mounted on the semiconductor device.

Figure 10A:
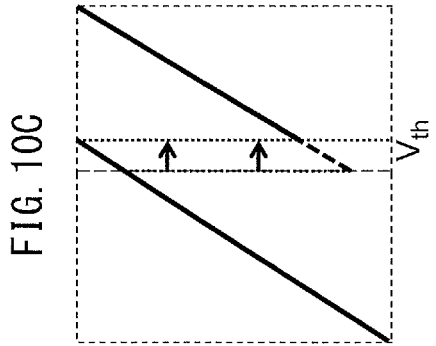
FIG. 10 is a diagram illustrating the feature of an AD converter according to the present invention.

As above, the configuration and the functions of the AD converter 1 of the first embodiment according to the present invention are explained with reference to FIGS. 1 to 9. In the AD converter 1 of the first embodiment according to the present invention, it is possible to reduce an error in conversion than that in the conventional AD converter, by setting the value of the amplification degree of β of the MDAC 14 to a value larger than 1 and smaller than 2 and at the same time, by having the function to estimate the amplification degree of β. With reference to FIG. 10, the feature of the AD converter 1 of the first embodiment according to the present invention is explained in more detail. FIG. 10 is a diagram illustrating a comparison between the conventional AD converter and the AD converter 1 of the first embodiment according to the present invention. As illustrated in FIG. 10A, in the conventional AD converter, there is a possibility that miscoding occurs, since the threshold value $V_{th}$ deviates from a predetermined value, the amplification degree deviates from 2, an offset occurs in the operational amplifier, etc.

Figure 10B:
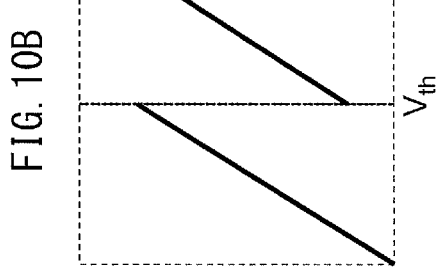
Figure 10C:
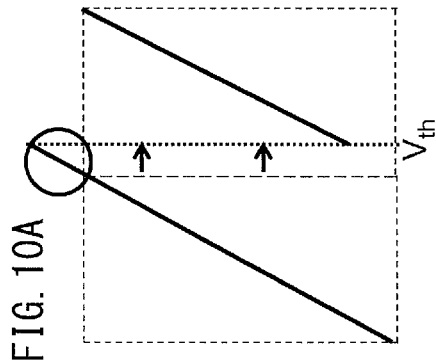
Figure 10D:
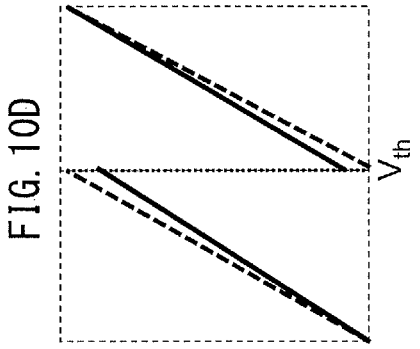

On the other hand, as illustrated in FIGS. 10B to 10D, in the AD converter 1 of the first embodiment according to the present invention, it is possible to set the amplification degree of β of the signal in the MDAC 14 to the value of β larger than 1 and smaller than 2, and to estimate the value of β in the β estimator 30, and therefore it is unlikely that miscoding occurs due to the deviation in the threshold value $V_{th}$. Thus, in the AD converter 1 of the first embodiment according to the present invention, the circuit design not dependent on the element accuracy is enabled and the circuit design is facilitated.

It is advantageous to put the value of the amplification degree of β of the MDAC 14 as close as possible to 2 in the range not exceeding 2 even in the worst-case design. The reason is that it is possible to estimate the value of β using a smaller number of bits when estimating the value of β as described above, and in addition, the number of bits of the β-adic digital signal necessary to obtain the resolution equivalent to that of the binary digital signal is reduced. It is necessary for N and M to have a relationship expressed by expression (16) below, where N is the number of bits of the binary digital signal and M is the number of bits of the β-adic digital signal necessary to obtain the resolution equivalent to that of the N-bit binary digital signal.

$$\beta^M \geq 2^N \tag{16}$$

Thus, the closer the value of β to 2, the smaller the number of bits of the β-adic digital signal necessary to obtain the resolution equivalent to that of the binary digital signal becomes, and therefore it is possible to reduce the amount of processing necessary to obtain a necessary resolution.

Figure 11:
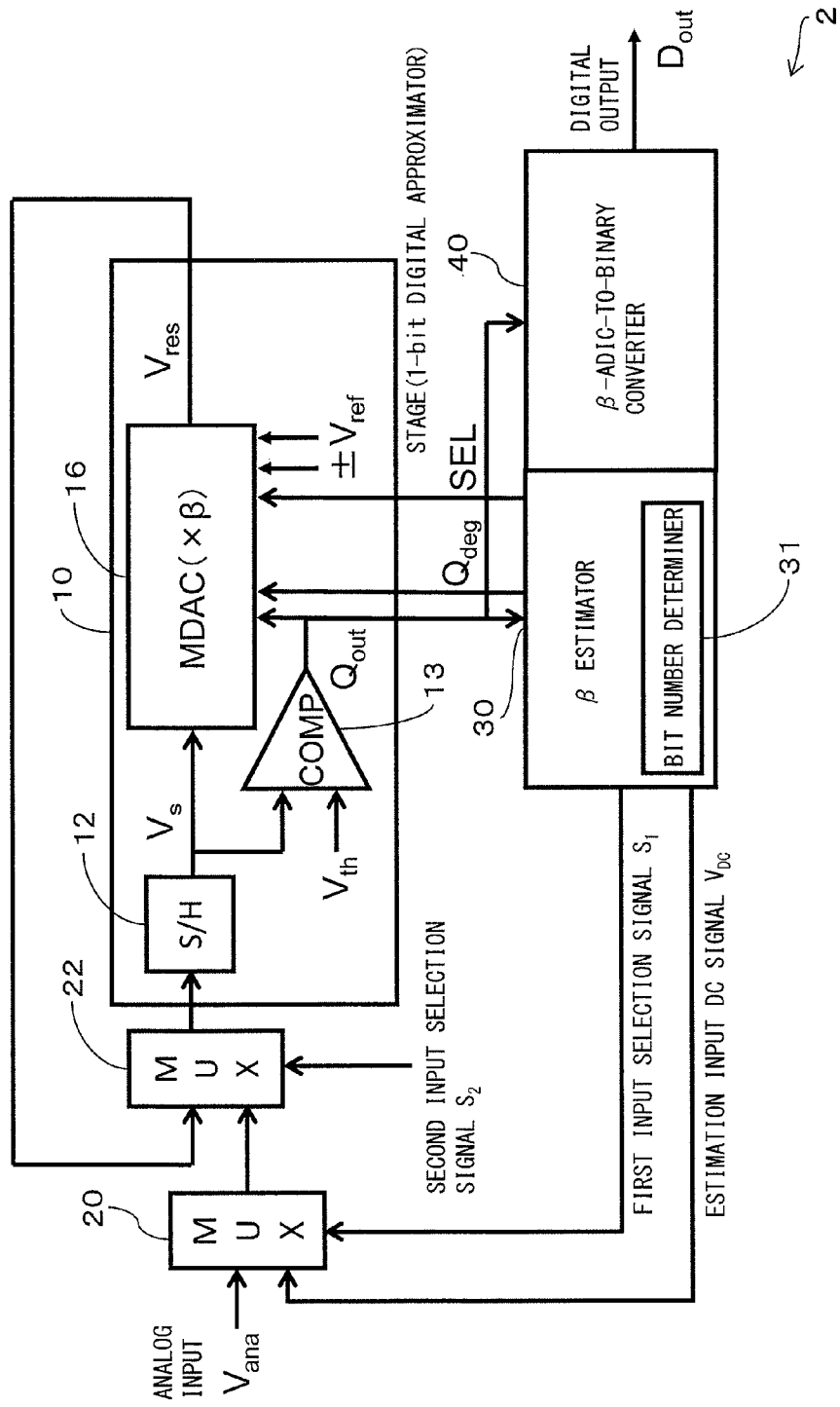
FIG. 11 is a diagram schematically illustrating a block of an AD converter of a second embodiment according to the present invention.

Next, with reference to FIG. 11, an AD converter 2 of a second embodiment according to the present invention is explained. FIG. 11 is a diagram illustrating the AD converter 2 of the second embodiment according to the present invention. The AD converter 2 of the second embodiment according to the present invention differs from the AD converter 1 of the first embodiment in that the β estimator 30 has a bit number determiner 31.

The bit number determiner 31 determines the number of bits of the digital output signal $D_{out}$ necessary for the AD converter 2 to obtain a predetermined resolution with the estimated value of β. As described above, in the AD converter according to the present invention in which the β-adic digital signal is used, as the value of β becomes smaller, the larger the number of bits of the digital output signal $D_{out}$ necessary to obtain a predetermined resolution becomes. Thus, if the value of β becomes smaller due to the variations in the manufacturing conditions, etc., then it may no longer be possible to obtain a necessary resolution with the number of bits of the digital output signal $D_{out}$ specified so as to obtain a predetermined resolution when the value of β is the median of the design. On the other hand, if the value of β becomes larger due to the variations in the manufacturing conditions, etc., a resolution higher than necessary is obtained with the number of bits of the digital output signal $D_{out}$ specified so as to obtain a predetermined resolution when the value of β is the median of the design, and therefore the calculation processing becomes redundant.

Thus, in the AD converter 2, in the case where the digital output signal $D_{out}$ to be converted does not have an appropriate number of bits, it is not possible to obtain a necessary resolution or a redundant calculation is performed as a result. Thus, the bit number determiner 31 is configured to determine the number of bits of the digital output signal $D_{out}$ so as to have a predetermined resolution with the value of β estimated by the β estimator 30. Preferably, it is possible for the bit number determiner 31 to determine the number of bits of the digital output signal $R_{out}$ so that the resolution with the value of β estimated by the β estimator 30 is substantially equal to the resolution specified in the case where the value of β is the median of the design. For example, it is possible for the bit number determiner 31 to determine the number of bits of the digital output signal $D_{out}$ using a relationship expressed by expression (17) below $$\beta_e^P \geq \beta_t^Q \tag{17}$$

$\beta_e$ is the value of β estimated by the β estimator 30, $\beta_t$ is the median of the value of β, β is the number of bits determined by the bit number determiner 31, and Q is the number of bits necessary to obtain a predetermined resolution when the value of β is the median.

Further, it is possible for the bit number determiner 31 to store data that associates the estimated value of β and the number of bits of the digital output signal $D_{out}$ necessary to obtain a predetermined resolution with the value of β, and to determine the number of bits of the digital output signal $D_{out}$ based on the data.

As described above, in the AD converter 2 of the second embodiment according to the present invention, the bit number determiner 31 determines the number of bits of the digital output signal $D_{out}$ so as to have a predetermined resolution with the value of β estimated by the β estimator 30, and thereby, it is possible to obtain a necessary resolution even if the value of β changes due to the variations in the manufacturing conditions and conversion processing without redundancy is enabled.

Figure 12:
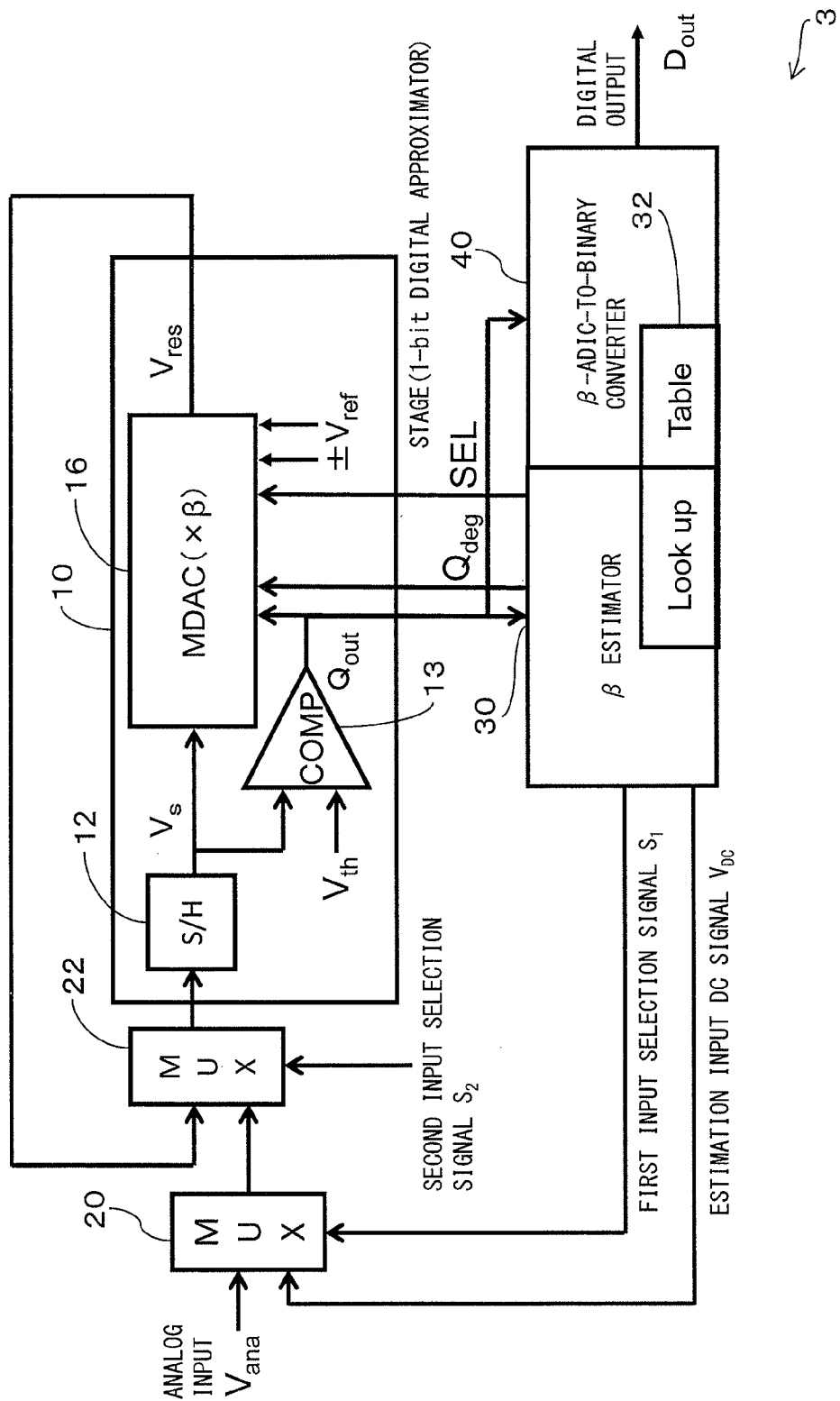
FIG. 12 is a diagram schematically illustrating a block of an AD converter of a third embodiment according to the present invention.

Next, with reference to FIGS. 12 and 13, an AD converter 3 of a third embodiment according to the present invention is explained. FIG. 12 is a diagram illustrating the AD converter 3 of the third embodiment according to the present invention. The AD converter 3 of the third embodiment according to the present invention differs from the AD converter 1 of the first embodiment in that the β estimator 30 and the β-adic-to-binary converter 40 have a common lookup table (hereinafter, also referred to as LUT) 32.

With reference to the LUT 32 illustrated in FIG. 13, processing to convert a β-adic digital signal into a binary digital signal is explained.

FIG. 13 is a diagram illustrating an example of the LUT 32. In the LUT 32, a plurality of values of β and powers of β corresponding to a plurality of exponents of the value of β are shown for each value of β. For example, the value stored in the row in which the value of β is 1.1 and in the column in which the exponent is 0 is $1.1^{-1}$. In general, the LUT 32 is stored in a nonvolatile memory, such as a ROM and a flash memory, and therefore the stored value is a binary digital signal. In FIG. 13, in the LUT 32, powers of β with the exponents from −1 to −16 are described, however, as described above, it is necessary for the LUT 32 of the AD converter 3 to have powers of β sufficient to estimate the value of β with a predetermined resolution even when the value of β is in the worst-case design. It may also be possible to specify an exponent as the maximum value of the exponents specified in the LUT, with which the resolution in the case where the value of β is the value if the worst-case design is substantially equal to the predetermined resolution. It is possible for the β estimator 30 to obtain a necessary resolution even in the worst-case design and estimation processing without redundancy is enabled, by specifying the maximum value in this manner.

Further, it may also be possible to store values related to powers of β in the LUT 32, such as a value calculated by multiplying the power of β by the value of β from which 1 is subtracted. The conversion processing in the β-adic-to-binary converter 40 is further facilitated, by storing the value calculated by multiplying the power of β by the value of β from which 1 is subtracted, since multiplication processing can be omitted.

With reference to FIG. 13, processing to convert a β-adic digital signal into a binary digital signal is explained specifically using an example in which a 6-bit β-adic digital signal (011011) is converted into a binary digital signal. The AD converter 3 converts each of a plurality of values of β stored in the LUT 32 into a binary digital signal based on the β-adic digital signal (011011). In the LUT 32 illustrated in FIG. 13, conversion processing is performed for each of β=1.1, 1.2, 1.3, etc. For example, for β=1.1, conversion processing as follows is performed $$b_{11} = (\beta - 1)(1.1^{-2} + 1.1^{-3} + 1.1^{-5} + 1.1^{-6}) \quad (18).$$

Table 1 illustrates an example of the total number of bits of the memory necessary to configure the LUT 32. The example of Table 1 is the LUT 32 when estimating the value of β by sweeping the value of β with an accuracy of $2^{16}$ using data after 24-step AD conversion in order to implement a 16-bit β-adic AD converter in the case where it is assumed that the worst-case value of the value of β has an error of ±10% from the ideal value. The number of bits of the digital signal $D_{out}$ in the LUT 32 is 16, the exponent (number of times β is multiplied by itself) of the LUT 32 is 24-bit digital data, the worst-case value of the value of β is in the range of ±10% from the median, the value of β is swept with a resolution of $2^{16}$, and the value of each exponent is stored.

[Table 1]

Word length: $W = 2 \times 16 = 32$

Memory width: COL = $32 \times 24 = 768$

Memory length: ROW = $0.2 \times 2^{16} \approx 13107$

Total number of bits: $M = 768 \times 13107 = 10,066,176$

From Table 1 it is understood that the LUT 32 can be implemented by a ROM table of several megabits in order to implement processing at the level required for a general AD converter.

As described above, the AD converter 3 of the third embodiment according to the present invention has the LUT 32, and therefore the calculation circuit of the β estimator 30 and the β-adic-to-binary converter 40 can be simplified. In other words, in the AD converter 1 of the first embodiment according to the present invention, it is necessary for the β estimator 30 and the β-adic-to-binary converter 40 to perform multiplication processing, and therefore it is necessary to include many adders whose circuit scale is large, however, in the AD converter 3, it is possible to reduce the circuit scale.

Figure 14:
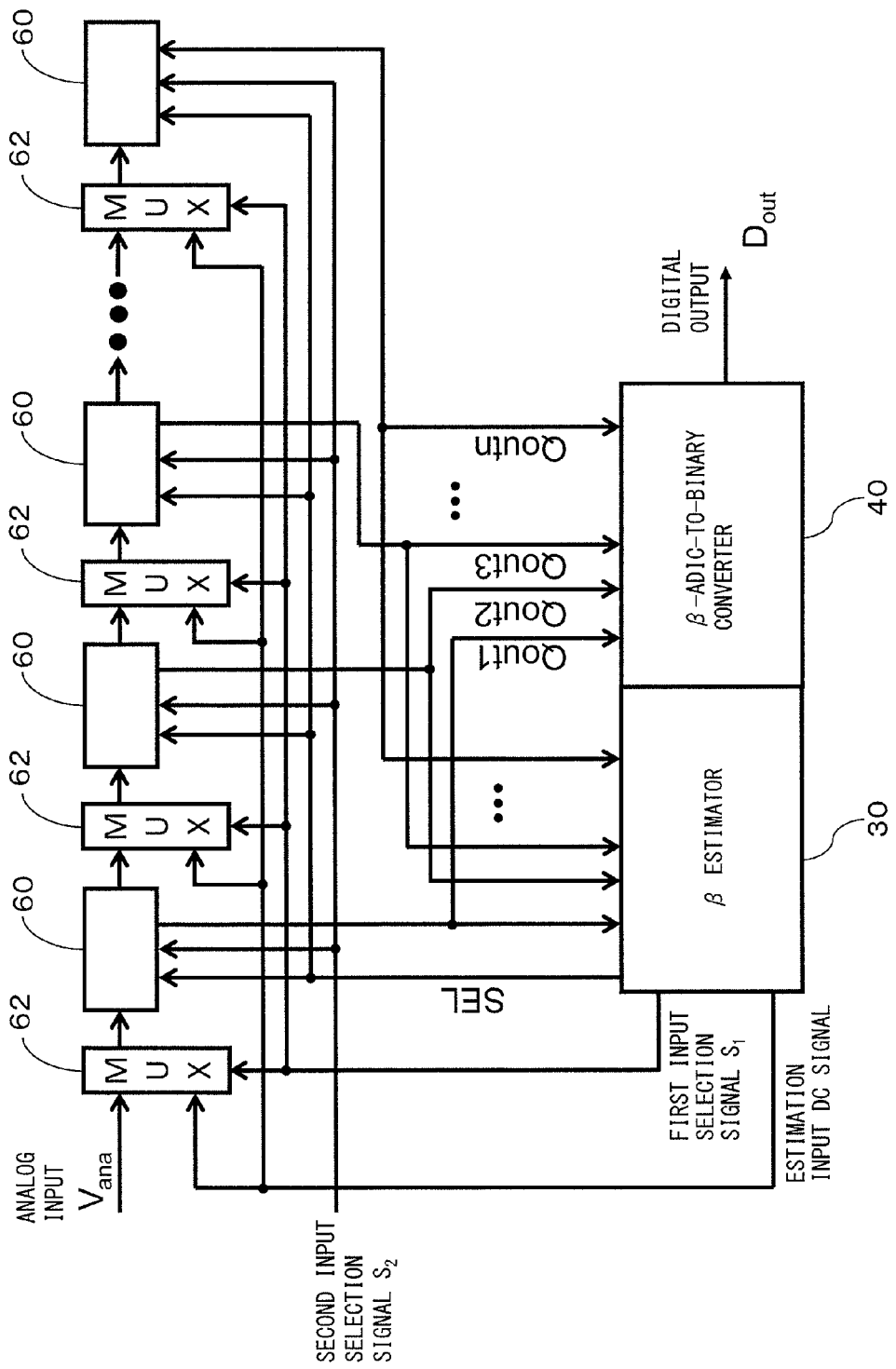
FIG. 14 is a diagram schematically illustrating a block of an AD converter of a fourth embodiment according to the present invention.
Figure 15:
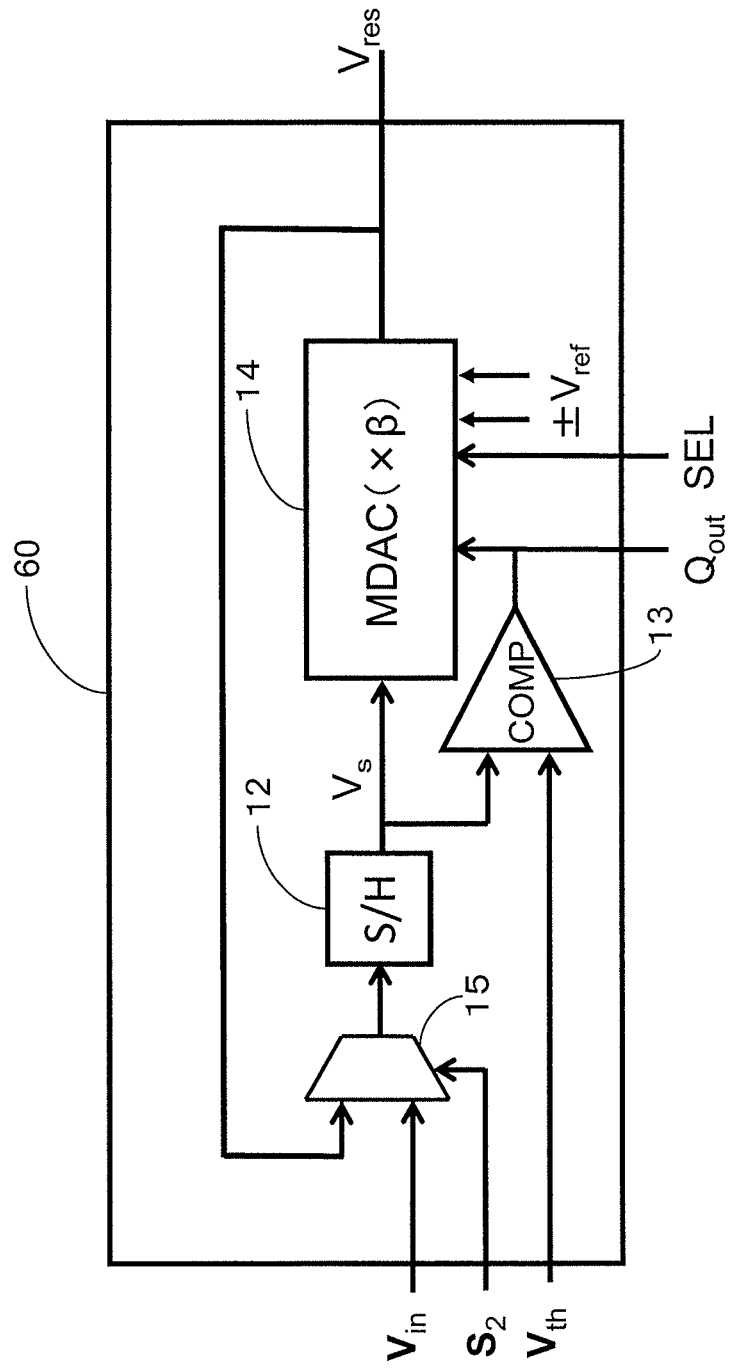
FIG. 15 is a diagram illustrating a detailed circuit of an MDAC illustrated in FIG. 14.
Figure 16A:
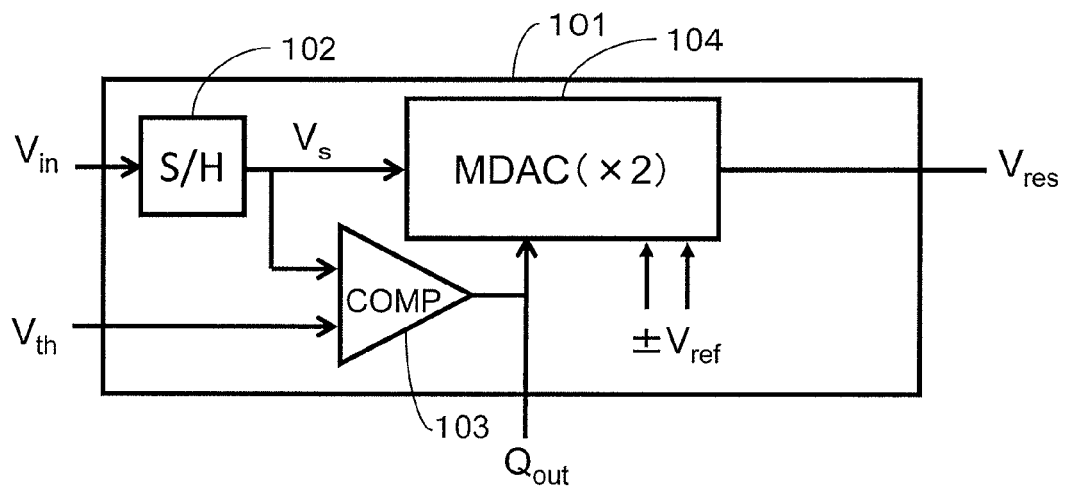
FIG. 16A is a diagram illustrating a circuit of a conventional digital approximator.
Figure 16B:
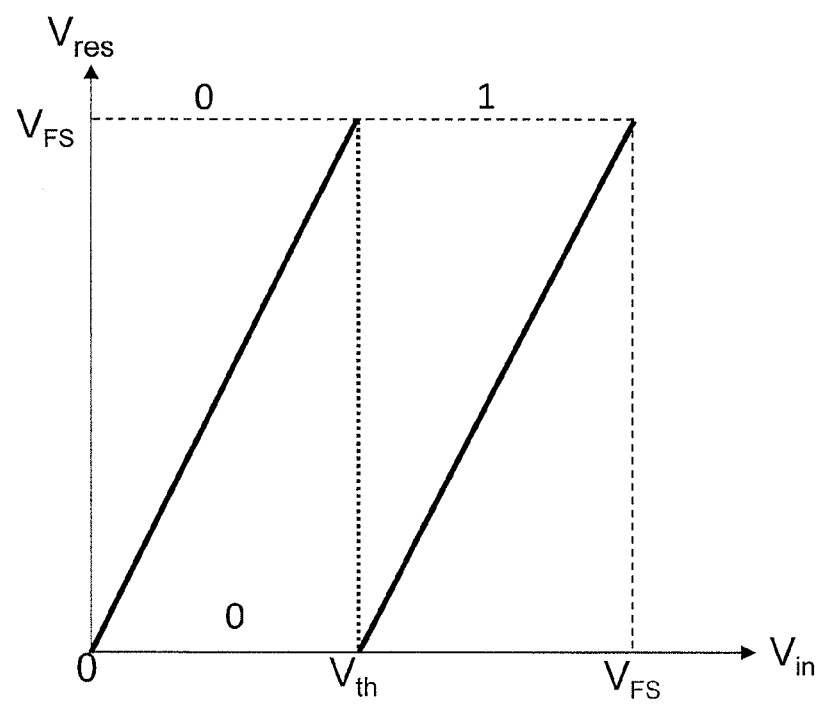
FIG. 16B is a diagram illustrating the input/output characteristics of the conventional digital approximator.
Figure 16C:
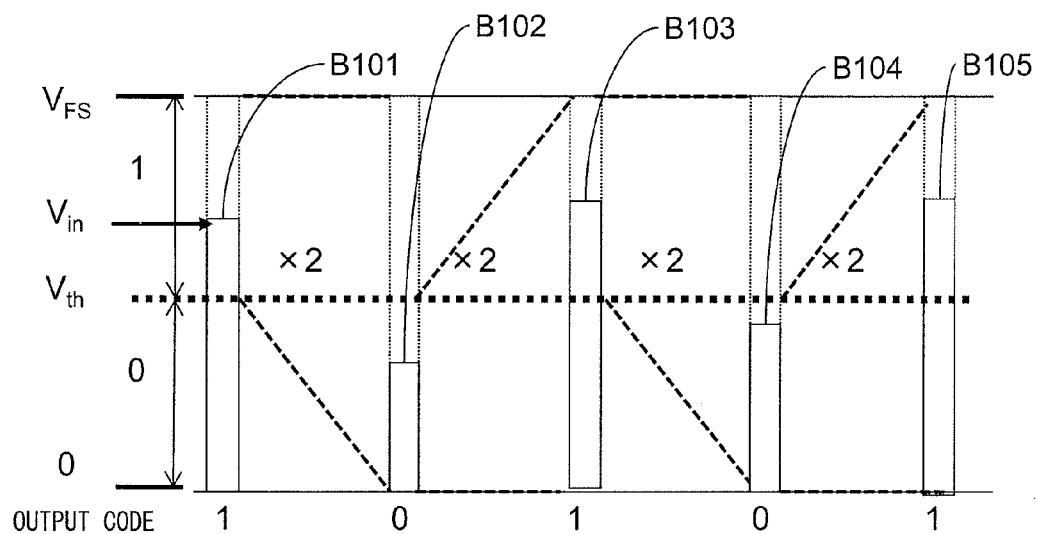
FIG. 16C is a diagram illustrating an example of a sequence of the operation of a conventional AD converter.
Figure 16D:
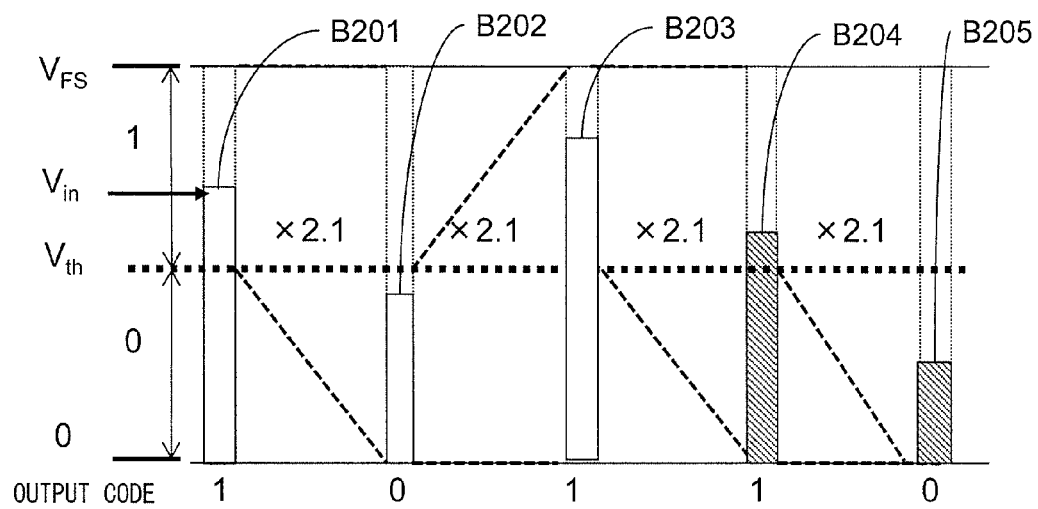
FIG. 16D is a diagram illustrating another example of the sequence of the operation of the conventional AD converter.

Next, with reference to FIG. 14 and FIG. 15, an AD converter 4 of a fourth embodiment according to the present invention is explained. FIG. 14 is a diagram illustrating the AD converter 4 of the fourth embodiment according to the present invention. The AD converter 4 differs from the AD converters 1 to 3 of the first to third embodiments in that the AD converter is of pipeline type in which a plurality of digital approximators 60 is cascade-connected, not the cyclic type AD converter. In other words, the AD converter 4 has a plurality of digital approximators 60 connected in series to an input terminal, the β estimator 30, and the β-adic-to-binary converter 40.

The configuration of the AD converter 4 is as follows. The digital approximator 60 in the first stage, to which one of the analog input signal $V_{ana}$ and the estimation input DC signal $V_{DC}$ selected by a multiplexer 62 based on the first input selection signal $S_1$ is input, supplies the residual signal $V_{res}$ as the input signal $V_{in}$ of the digital approximator 60 in the second stage. The digital approximator 60 in the second stage supplies the residual signal $V_{res}$ as the input signal $V_{in}$ of the digital approximator 60 in the third stage via the multiplexer 62. Similarly, the digital approximator 60 in the Nth stage supplies the residual signal $V_{res}$ as the input signal $V_{in}$ of the digital approximator 60 in the (N+1)th stage. Further, the digital value $Q_{out}$ output from each of the plurality of digital approximators 60 is output to the β estimator 30 and the β-adic-to-binary converter 40. Furthermore, an input voltage of a digital approximator circuit at the time of estimation of β is output from the β estimator 30 and input to each of the plurality of digital approximators 60.

Since AD converter 4 has the plurality of digital approximators 60, the AD converter 4 is configured to estimate the value of β for each of the digital approximators 60. FIG. 15 illustrates an example of the circuit of the digital approximator 60. As illustrated in FIG. 15, the digital approximator 60 has a multiplexer 15 configured to selectively output the input signal $V_{in}$ and the residual signal $V_{res}$ based on the second input selection signal $S_2$. The multiplexer 15 is configured to select the residual signal $V_{res}$ when the value of β is estimated and to select the input signal $V_{in}$ when the normal conversion processing is performed. The value of β estimated for each of the digital approximators 60 is stored in the β estimator 30 for each of the digital approximators 60.

In the case where the AD converter 4 has the LUT 3 as the AD converter 3 of the third embodiment according to the present invention does, the β estimator 30 estimates the value of β for each of the digital approximators 60 using the LUT 32 by the same method as that of the AD converter 1 of the first embodiment. In this case, the β estimator 30 estimates the value of β for each of the digital approximators 60 by referring to the LUT for each of the plurality of digital approximators 60 included in the AD converter 4. Then, the β estimator 30 stores the values of β used for the exponents corresponding to the respective digital approximators 60. In other words, in the case where the values of β are different in the digital approximators 60 due to the variations in the manufacturing conditions, etc., the β estimator 30 stores the values of β different from exponent to exponent.

The number of stages of the plurality of digital approximators 60 needs to be sufficient in order to estimate the value of β with a predetermined resolution even when the value of β is the value of the worst-case design. It may also be possible to specify a number as the maximum value of the number of stages of the plurality of digital approximators 60, with which the resolution in the case where the value of β is the value in the worst-case design is substantially equal to the predetermined resolution. By specifying the number of stages of the plurality of digital approximators 60 in this manner, it is possible for the β estimator 30 to obtain a necessary resolution even in the worst-case design and estimation processing without redundancy is enabled. It may also be possible to configure each of the plurality of digital approximators 60 configuring the AD converter 4 so as to be capable of selectively stopping supply of the power source voltage.

It is not necessary for the β estimator 30 to estimate the value of β for all of the digital approximators 60 included in the AD converter 4. The reason is that the higher-order bit of the digital signal, such as the MSB, requires a high accuracy of the value of β, however, the lower-order bit, such as the LSB, does not require a high accuracy. For example, it may also be possible to configure the AD converter 4 so that the value of β is estimated only for the digital approximators 60 that calculate the three higher-order bits.

Further, it is possible for the AD converter 4 to include the configuration that can also be applied to the pipeline type AD converter among the various kinds of configurations explained in the AD converters 1 to 3 of the first to third embodiments. For example, it is possible for the AD converter 4 to estimate the value of β so as to have a predetermined resolution even in the case where the value of β is the value in the worst-case design. Further, it may also be possible for the AD converter 4 to have the bit number determiner 31 as the AD converter 2 of the second embodiment does.

As above, with reference to FIGS. 1 to 15, the AD converters according to the present invention are explained, however, the AD converters according to the present invention are not limited to these specific descriptions, and therefore there can be various kinds of modifications.

For example, in the AD converters explained in the present specification, the β-adic-to-binary converter 40 converts a β-adic digital signal into a binary digital signal and outputs as a binary digital output signal, however, the AD converters according to the present invention may output a β-adic digital signal as a digital output signal. In this case, the β-adic digital signal is converted into a binary digital signal by a calculation device arranged inside or outside the semiconductor device on which the AD converter according to the present invention is mounted.

Further, for the specific circuit configuration of the MDAC, various kinds of modifications are considered. For example, as described in "A 15-b 1-Msample/s Digitally Self-Calibrated Pipeline ADC (IEEE JOURNAL OF SOLID-STATE CIRCUITS, VOL. 28, NO. 2, DECEMBER 1993) by Andrew N. Karanicolas, Member et al., it is possible to implement the amplification degree of β by switching the three capacitors C1, C2, and C3 (C1=C2).

The AD converter according to the present invention has the specific circuit configuration invented by applying the β expansion proposed in the joint research in the Cabinet Office, Government of Japan and the Japan Society for the Promotion of Science through the Funding Program for World-Leading Innovative R&D on Science and Technology to the AD converter.

EXPLANATIONS OF LETTERS OR NUMERALS

1, 2, 3, 4 AD converter
10, 60 digital approximator
12 portion having sample/hold function
13 comparator
14, 16 MDAC
20, 22 multiplexer
30 β estimator
31 bit number determiner
32 lookup table
40 β-adic-to-binary converter

What is claimed is:

1. A cyclic-type analog-digital converter for converting an analog input signal that is input into a digital signal having a predetermined resolution, the analog-digital converter comprising:
   a digital approximator including a comparator configured to compare the magnitude of a first analog signal that is input and a threshold value and to output a digital value indicative of the comparison result and a multiplying digital-analog converter configured to amplify the first analog signal by a factor of β and at the same time, to perform a predetermined calculation in accordance with the comparison result of the comparator to output a second analog signal;
   a multiplexer configured to output an analog input signal as the first analog signal when calculating the most significant bit and to output the second analog signal as the first analog signal when calculating a bit other than the most significant bit;
   a β estimator configured to estimate the value of β; and
   a digital signal output unit configured to sequentially take in the digital value output from the comparator and to output the digital value as a digital signal based on an estimated value of β, wherein
   the value of β is a value larger than 1 and smaller than 2.

2. A pipeline-type analog-digital converter for converting an analog input signal that is input to an input terminal into a digital signal having a predetermined resolution, the analog-digital converter comprising:
   a plurality of digital approximators including a comparator configured to compare the magnitude of a first analog signal that is input and a threshold value and to output a digital value indicative of the comparison result and a multiplying digital-analog converter configured to amplify the first analog signal by a factor of β and at the same time, to perform a predetermined calculation in accordance with the comparison result of the comparator to output a second analog signal, the plurality of digital approximators being connected in series to the input terminal and the second analog signal of the digital approximator in the previous stage being provided to the digital approximator in the subsequent stage as the first analog signal;
   a β estimator configured to estimate the values of β of the plurality of digital approximators; and
   a digital signal output unit configured to sequentially take in the digital value output from the comparator and to output the digital value as a digital signal based on an estimated value of β, wherein
   the value of β is a value larger than 1 and smaller than 2.

3. The analog-digital converter according to claim 1, wherein
   the β estimator estimates the value of β using two β-adic digital signals having a predetermined number of bits and acquired by converting the same input signal, and the predetermined number of bits of a plurality of β-adic digital signals used when the value of β is estimated is specified so that the resolution in the case where the value of β is the value in the worst-case design is substantially equal to the predetermined resolution.

4. The analog-digital converter according to claim 1, wherein
the number of bits of the digital signal is determined so that the resolution with the estimated value of $\beta$ is substantially equal to the predetermined resolution.

5. The analog-digital converter according to claim 1, wherein
the digital signal output unit outputs the digital signal as a binary digital signal using the estimated value of $\beta$.

6. The analog-digital converter according to claim 1, wherein
the $\beta$ estimator estimates the value of $\beta$ by converting an estimation input DC signal that can be converted into two digital signals into two digital signals, i.e., a first estimation $\beta$-adic digital signal whose most significant bit is 1 and a second estimation $\beta$-adic digital signal whose most significant bit is 0 and by minimizing a difference between the first estimation $\beta$-adic digital signal and the second estimation $\beta$-adic digital signal.

7. The analog-digital converter according claim 1, wherein
the $\beta$ estimator estimates the value of $\beta$ using a lookup table that specifies values related to powers of $\beta$ corresponding to a plurality of values of the $\beta$ and a plurality of exponents of the values of $\beta$ for each value of $\beta$.

8. The analog-digital converter according to claim 7, wherein
the maximum value of the exponents of the values of $\beta$ specified in the lookup table is specified so that the resolution in the case where the value of $\beta$ is the value in the worst-case design is substantially equal to the predetermined resolution.

9. The analog-digital converter according to claim 1, wherein
the predetermined calculation is performed by adding the value of $\beta$ from which 1 is subtracted multiplied by a first reference signal to the value of the first analog signal multiplied by $\beta$ in the case where the magnitude of the first analog signal is smaller than a threshold value, or by adding the value of $\beta$ from which 1 is subtracted multiplied by a second reference signal to the value of the first analog signal multiplied by $\beta$ in the case where the magnitude of the first analog signal is greater than a threshold value.

10. The analog-digital converter according to claim 9, wherein
the multiplying digital-analog converter has two capacitor having different capacitance values and an operational amplifier connected to the capacitors via a switch.

11. The analog-digital converter according to claim 1, wherein
the value of $\beta$ in the worst-case design is less than 2 and the value of $\beta$ in the worst-case design is a value close to 2.

12. The analog-digital converter according to claim 2, wherein
the $\beta$ estimator estimates the value of $\beta$ using two $\beta$-adic digital signals having a predetermined number of bits and acquired by converting the same input signal, and
the number of the plurality of digital approximators is specified so that the resolution in the case where the value of $\beta$ is the value in the worst-case design is substantially equal to the predetermined resolution.

13. The analog-digital converter according to claim 2, wherein
the $\beta$ estimator estimates the values of $\beta$ of several digital approximators that calculate the higher-order bits of the digital signal but does not estimate the values of $\beta$ of the other digital approximators.

14. A method for estimating a value of an amplification degree of $\beta$ of an analog-digital converter comprising a multiplying digital-analog converter whose amplification degree is $\beta$ and having a predetermined resolution, the method comprising the steps of:
inputting the same estimation input DC signal to the analog-digital converter;
converting the input signal into two $\beta$-adic digital signals; and
estimating the value of the amplification degree of $\beta$ based on a plurality of converted $\beta$-adic digital signals, wherein
the value of $\beta$ is a value larger than 1 and smaller than 2, and
the number of bits of the plurality of converted $\beta$-adic digital signals is specified so that the resolution in the case where the value of $\beta$ is the value in the worst-case design is substantially equal to the predetermined resolution.

15. The method according to claim 14, wherein
the analog-digital converter further has a lookup table that specifies values related to powers of the $\beta$ corresponding to a plurality of values of the $\beta$ and a plurality of exponents of the values of $\beta$ for each value of $\beta$, and
the maximum value of the exponents specified in the lookup table is specified so that the resolution in the case where the value of $\beta$ is the value in the worst-case design is substantially equal to the predetermined resolution.

16. The method according to claim 14, wherein
the analog-digital converter is a pipeline-type converter in which a plurality of digital approximators are connected in series to an input terminal, and
the number of digital approximators is specified so that the resolution in the case where the value of $\beta$ is the value in the worst-case design is substantially equal to the predetermined resolution.

* * * * *